(12) United States Patent
Glenn et al.

(10) Patent No.: US 8,881,816 B2
(45) Date of Patent: Nov. 11, 2014

(54) SHOCK LOAD MITIGATION IN A DOWNHOLE PERFORATION TOOL ASSEMBLY

(75) Inventors: Timothy S. Glenn, Dracut, MA (US); John P. Rodgers, Keller, TX (US); Jeff A. Nelson, Houston, TX (US); John D. Burleson, Denton, TX (US); Marco Serra, Dinhard (CH); John H. Hales, Frisco, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 13/377,148

(22) PCT Filed: Apr. 29, 2011

(86) PCT No.: PCT/US2011/034690
§ 371 (c)(1),
(2), (4) Date: Dec. 8, 2011

(87) PCT Pub. No.: WO2012/148429
PCT Pub. Date: Nov. 1, 2012

(65) Prior Publication Data
US 2012/0273201 A1    Nov. 1, 2012

(51) Int. Cl.
*E21B 29/00*    (2006.01)

(52) U.S. Cl.
USPC ............... 166/297; 166/55; 166/299; 175/4.5

(58) Field of Classification Search
USPC ............ 166/378, 55, 797, 299, 297; 175/4.5; 285/137.11, 141, 222, 331
See application file for complete search history.

(56) References Cited

U.S. PATENT DOCUMENTS

| | | | |
|---|---|---|---|
| 2,833,213 A | 5/1958 | Udry |
| 2,980,017 A | 4/1961 | Castel |
| 3,057,296 A | 10/1962 | Silverman |
| 3,128,825 A | 4/1964 | Blagg |
| 3,143,321 A | 8/1964 | McGehee et al. |
| 3,208,378 A | 9/1965 | Boop |
| 3,216,751 A | 11/1965 | Der Mott |

(Continued)

FOREIGN PATENT DOCUMENTS

| | | |
|---|---|---|
| GB | 2406870 A | 4/2005 |
| WO | 2004076813 A1 | 9/2004 |

(Continued)

OTHER PUBLICATIONS

Rodgers, John P., et al., Patent Application entitled "Coupler Compliance Tuning for Mitigating Shock Produced by Well Perforating," filed Dec. 14, 2011, U.S. Appl. No. 13/325,726.

(Continued)

*Primary Examiner* — Yong-Suk (Philip) Ro

(57) ABSTRACT

A perforation tool assembly is provided. The perforation tool assembly comprises an energy train, a first perforation gun, and a second perforation gun. The energy train comprises a moderator to reduce the speed of propagation of a detonation in a direction parallel to the axis of the perforation tool assembly. The first perforation gun comprises a plurality of explosive charges coupled to a first portion of the energy train. The second perforation gun comprises a plurality of explosive charges coupled to a second portion of the energy train, wherein the second portion of the energy train is coupled to the first portion of the energy train.

20 Claims, 10 Drawing Sheets

(56) References Cited

U.S. PATENT DOCUMENTS

| | | |
|---|---|---|
| 3,394,612 A | 7/1968 | Bogosoff et al. |
| 3,414,071 A | 12/1968 | Alberts |
| 3,599,719 A | 8/1971 | Brown |
| 3,653,468 A | 4/1972 | Marshall |
| 3,687,074 A | 8/1972 | Andrews et al. |
| 3,779,591 A | 12/1973 | Rands |
| 3,923,105 A | 12/1975 | Lands, Jr. |
| 3,923,107 A | 12/1975 | Dillard |
| 3,971,926 A | 7/1976 | Gau et al. |
| 4,269,063 A | 5/1981 | Escaron et al. |
| 4,319,526 A | 3/1982 | DerMott |
| 4,346,795 A | 8/1982 | Herbert |
| 4,409,824 A | 10/1983 | Salama et al. |
| 4,410,051 A | 10/1983 | Daniel et al. |
| 4,419,933 A | 12/1983 | Kirby et al. |
| 4,480,690 A | 11/1984 | Vann |
| 4,575,026 A | 3/1986 | Brittain et al. |
| 4,598,776 A | 7/1986 | Stout |
| 4,612,992 A | 9/1986 | Vann et al. |
| 4,619,333 A | 10/1986 | George |
| 4,637,478 A | 1/1987 | George |
| 4,679,669 A | 7/1987 | Kalb et al. |
| 4,693,317 A | 9/1987 | Edwards et al. |
| 4,694,878 A | 9/1987 | Gambertoglio |
| 4,764,231 A | 8/1988 | Slawinski et al. |
| 4,817,710 A | 4/1989 | Edwards et al. |
| 4,829,901 A | 5/1989 | Yates, Jr. |
| 4,830,120 A | 5/1989 | Stout |
| 4,842,059 A | 6/1989 | Tomek |
| 4,901,802 A | 2/1990 | George et al. |
| 4,913,053 A | 4/1990 | McPhee |
| 4,971,153 A | 11/1990 | Rowe et al. |
| 5,027,708 A | 7/1991 | Gonzalez et al. |
| 5,044,437 A | 9/1991 | Wittrisch |
| 5,078,210 A | 1/1992 | George |
| 5,088,557 A | 2/1992 | Ricles et al. |
| 5,092,167 A | 3/1992 | Finley et al. |
| 5,103,912 A | 4/1992 | Flint |
| 5,107,927 A | 4/1992 | Whiteley et al. |
| 5,109,355 A | 4/1992 | Yuno |
| 5,117,911 A | 6/1992 | Navarette et al. |
| 5,131,470 A | 7/1992 | Miszewski et al. |
| 5,133,419 A | 7/1992 | Barrington |
| 5,161,616 A | 11/1992 | Colla |
| 5,188,191 A | 2/1993 | Tomek |
| 5,216,197 A | 6/1993 | Huber et al. |
| 5,287,924 A | 2/1994 | Burleson et al. |
| 5,320,169 A | 6/1994 | Delatorre |
| 5,343,963 A | 9/1994 | Bouldin et al. |
| 5,351,791 A | 10/1994 | Rosenzweig |
| 5,366,013 A | 11/1994 | Edwards et al. |
| 5,421,780 A | 6/1995 | Vukovic |
| 5,529,127 A | 6/1996 | Burleson et al. |
| 5,547,148 A | 8/1996 | Del Monte et al. |
| 5,598,891 A | 2/1997 | Snider et al. |
| 5,598,894 A | 2/1997 | Burleson et al. |
| 5,603,379 A | 2/1997 | Henke et al. |
| 5,667,023 A | 9/1997 | Harrell et al. |
| 5,774,420 A | 6/1998 | Heysse et al. |
| 5,813,480 A | 9/1998 | Zaleski, Jr. et al. |
| 5,823,266 A | 10/1998 | Burleson et al. |
| 5,826,654 A | 10/1998 | Adnan et al. |
| 5,957,209 A | 9/1999 | Burleson et al. |
| 5,964,294 A | 10/1999 | Edwards et al. |
| 5,992,523 A | 11/1999 | Burleson et al. |
| 6,012,015 A | 1/2000 | Tubel |
| 6,021,377 A | 2/2000 | Dubinsky et al. |
| 6,068,394 A | 5/2000 | Dublin, Jr. |
| 6,078,867 A | 6/2000 | Plumb et al. |
| 6,098,716 A | 8/2000 | Hromas et al. |
| 6,135,252 A | 10/2000 | Knotts |
| 6,173,779 B1 | 1/2001 | Smith |
| 6,216,533 B1 | 4/2001 | Woloson et al. |
| 6,230,101 B1 | 5/2001 | Wallis |
| 6,283,214 B1 | 9/2001 | Guinot et al. |
| 6,308,809 B1 | 10/2001 | Reid et al. |
| 6,371,541 B1 | 4/2002 | Pedersen |
| 6,394,241 B1 | 5/2002 | Desjardins et al. |
| 6,397,752 B1 | 6/2002 | Yang et al. |
| 6,408,953 B1 | 6/2002 | Goldman et al. |
| 6,412,415 B1 | 7/2002 | Kothari et al. |
| 6,412,614 B1 | 7/2002 | Lagrange et al. |
| 6,450,022 B1 | 9/2002 | Brewer |
| 6,454,012 B1 | 9/2002 | Reid |
| 6,457,570 B2 | 10/2002 | Reid et al. |
| 6,484,801 B2 | 11/2002 | Brewer et al. |
| 6,543,538 B2 | 4/2003 | Tolman et al. |
| 6,550,322 B2 | 4/2003 | Sweetland et al. |
| 6,595,290 B2 | 7/2003 | George et al. |
| 6,672,405 B2 | 1/2004 | Tolman et al. |
| 6,674,432 B2 | 1/2004 | Kennon et al. |
| 6,679,323 B2 | 1/2004 | Vargervik et al. |
| 6,679,327 B2 | 1/2004 | Sloan et al. |
| 6,684,949 B1 | 2/2004 | Gabler et al. |
| 6,684,954 B2 | 2/2004 | George |
| 6,708,761 B2 | 3/2004 | George et al. |
| 6,810,370 B1 | 10/2004 | Watts, III |
| 6,826,483 B1 | 11/2004 | Anderson et al. |
| 6,832,159 B2 | 12/2004 | Smits et al. |
| 6,842,725 B1 | 1/2005 | Sarda |
| 6,868,920 B2 | 3/2005 | Hoteit et al. |
| 7,000,699 B2 | 2/2006 | Yang et al. |
| 7,006,959 B1 | 2/2006 | Huh et al. |
| 7,044,219 B2 | 5/2006 | Mason et al. |
| 7,114,564 B2 | 10/2006 | Parrott et al. |
| 7,121,340 B2 | 10/2006 | Grove et al. |
| 7,139,689 B2 | 11/2006 | Huang |
| 7,147,088 B2 | 12/2006 | Reid et al. |
| 7,165,612 B2 | 1/2007 | McLaughlin |
| 7,178,608 B2 | 2/2007 | Mayes et al. |
| 7,195,066 B2 * | 3/2007 | Sukup et al. .................. 166/298 |
| 7,234,517 B2 | 6/2007 | Streich et al. |
| 7,246,659 B2 | 7/2007 | Fripp et al. |
| 7,260,508 B2 | 8/2007 | Lim et al. |
| 7,278,480 B2 | 10/2007 | Longfield et al. |
| 7,387,160 B2 | 6/2008 | O'Shaughnessy et al. |
| 7,387,162 B2 * | 6/2008 | Mooney et al. ............... 166/297 |
| 7,503,403 B2 | 3/2009 | Jogi et al. |
| 7,509,245 B2 | 3/2009 | Siebrits et al. |
| 7,533,722 B2 | 5/2009 | George et al. |
| 7,600,568 B2 | 10/2009 | Ross et al. |
| 7,603,264 B2 | 10/2009 | Zamora et al. |
| 7,640,986 B2 | 1/2010 | Behrmann et al. |
| 7,721,650 B2 | 5/2010 | Barton et al. |
| 7,721,820 B2 | 5/2010 | Hill et al. |
| 7,762,331 B2 | 7/2010 | Goodman et al. |
| 7,770,662 B2 | 8/2010 | Harvey et al. |
| 8,126,646 B2 | 2/2012 | Grove et al. |
| 8,136,608 B2 | 3/2012 | Goodman |
| 8,181,718 B2 | 5/2012 | Burleson et al. |
| 8,186,259 B2 | 5/2012 | Burleson et al. |
| 8,393,393 B2 | 3/2013 | Rodgers et al. |
| 8,397,800 B2 | 3/2013 | Rodgers et al. |
| 8,397,814 B2 | 3/2013 | Rodgers et al. |
| 8,408,286 B2 | 4/2013 | Rodgers et al. |
| 2002/0121134 A1 | 9/2002 | Sweetland et al. |
| 2003/0062169 A1 | 4/2003 | Marshall |
| 2003/0089497 A1 | 5/2003 | George et al. |
| 2003/0150646 A1 | 8/2003 | Brooks et al. |
| 2004/0045351 A1 | 3/2004 | Skinner |
| 2004/0104029 A1 | 6/2004 | Martin |
| 2004/0140090 A1 | 7/2004 | Mason et al. |
| 2006/0070734 A1 | 4/2006 | Zillinger et al. |
| 2006/0118297 A1 | 6/2006 | Finci et al. |
| 2006/0243453 A1 | 11/2006 | McKee |
| 2007/0162235 A1 | 7/2007 | Zhan et al. |
| 2007/0193740 A1 | 8/2007 | Quint |
| 2007/0214990 A1 | 9/2007 | Barkley et al. |
| 2008/0041597 A1 | 2/2008 | Fisher et al. |
| 2008/0149338 A1 | 6/2008 | Goodman et al. |
| 2008/0202325 A1 | 8/2008 | Bertoja et al. |
| 2008/0216554 A1 | 9/2008 | McKee |
| 2008/0245255 A1 | 10/2008 | Barton et al. |
| 2008/0262810 A1 | 10/2008 | Moran et al. |

(56) References Cited

U.S. PATENT DOCUMENTS

| | | |
|---|---|---|
| 2008/0314582 A1 | 12/2008 | Belani et al. |
| 2009/0013775 A1 | 1/2009 | Bogath et al. |
| 2009/0071645 A1 | 3/2009 | Kenison et al. |
| 2009/0084535 A1 | 4/2009 | Bertoja et al. |
| 2009/0151588 A1 | 6/2009 | Burleson et al. |
| 2009/0151589 A1 | 6/2009 | Henderson et al. |
| 2009/0159284 A1 | 6/2009 | Goodman |
| 2009/0182541 A1 | 7/2009 | Crick et al. |
| 2009/0223400 A1 | 9/2009 | Hill et al. |
| 2009/0272529 A1 | 11/2009 | Crawford |
| 2009/0272839 A1 | 11/2009 | Clingman |
| 2009/0276156 A1 | 11/2009 | Kragas et al. |
| 2009/0294122 A1 | 12/2009 | Hansen et al. |
| 2010/0000789 A1* | 1/2010 | Barton et al. ............ 175/2 |
| 2010/0037793 A1 | 2/2010 | Lee et al. |
| 2010/0085210 A1 | 4/2010 | Bonavides et al. |
| 2010/0132939 A1 | 6/2010 | Rodgers |
| 2010/0133004 A1 | 6/2010 | Burleson et al. |
| 2010/0147519 A1 | 6/2010 | Goodman |
| 2010/0230105 A1 | 9/2010 | Vaynshteyn |
| 2011/0120695 A1 | 5/2011 | Burleson et al. |
| 2012/0085539 A1 | 4/2012 | Tonnessen et al. |
| 2012/0152519 A1 | 6/2012 | Rodgers et al. |
| 2012/0152614 A1 | 6/2012 | Rodgers et al. |
| 2012/0152615 A1 | 6/2012 | Rodgers et al. |
| 2012/0152616 A1 | 6/2012 | Rodgers et al. |
| 2012/0158388 A1 | 6/2012 | Rodgers et al. |
| 2012/0255722 A1 | 10/2012 | Rodgers et al. |
| 2012/0318508 A1 | 12/2012 | Glenn et al. |
| 2013/0048375 A1 | 2/2013 | Rodgers et al. |
| 2013/0048376 A1 | 2/2013 | Rodgers et al. |
| 2013/0248184 A1 | 9/2013 | Glenn et al. |

FOREIGN PATENT DOCUMENTS

| | | |
|---|---|---|
| WO | 2007056121 A1 | 5/2007 |
| WO | 2012082186 A1 | 6/2012 |
| WO | 2012082195 A1 | 6/2012 |

OTHER PUBLICATIONS

Foreign Communication From a Related Counterpart Application—International Search Report and Written Opinion, PCT/US2010/061102, Jul. 28, 2011.

Foreign Communication From a Related Counterpart Application—International Search Report and Written Opinion, PCT/US2011/029412, Nov. 22, 2011.

Rodgers, John P., et al., Patent Application entitled, "Modeling Shock Produced by Well Perforating," filed Aug. 15, 2011, U.S. Appl. No. 13/210,303.

Rodgers, John P., et al., Patent Application entitled "Perforating String with Longitudinal Shock De-Coupler", filed Dec. 14, 2011, U.S. Appl. No. 13/325,866.

Office Action Restriction dated Jul. 30, 2009, U.S. Appl. No. 11/957,541, filed Dec. 17, 2007.

Office Action dated Sep. 8, 2009, U.S. Appl. No. 11/957,541, filed Dec. 17, 2007.

Office Action dated Feb. 2, 2010, U.S. Appl. No. 11/957,541, filed Dec. 17, 2007.

Office Action dated Jul. 15, 2010, U.S. Appl. No. 11/957,541, filed Dec. 17, 2007.

Office Action dated Nov. 22, 2010, U.S. Appl. No. 11/957,541, filed Dec. 17, 2007.

Notice of Allowance dated Feb. 7, 2011, U.S. Appl. No. 11/957,541, filed Dec. 17, 2007.

Office Action dated May 4, 2011, U.S. Appl. No. 11/957,541, filed Dec. 17, 2007.

Final Office Action dated Oct. 24, 2011, U.S. Appl. No. 11/957,541, filed Dec. 17, 2007.

Notice of Allowance dated Jan. 27, 2012, U.S. Appl. No. 11/957,541, filed Dec. 17, 2007.

Office Action dated Apr. 21, 2011, U.S. Appl. No. 13/008,075, filed Jan. 18, 2011.

Final Office Action dated Oct. 24, 2011, U.S. Appl. No. 13/008,075, filed Jan. 18, 2011.

Advisory Action dated Jan. 17, 2012, U.S. Appl. No. 13/008,075, filed Jan. 18, 2011.

Notice of Allowance dated Jan. 25, 2012, U.S. Appl. No. 13/008,075, filed Jan. 18, 2011.

Office Action dated Jan. 27, 2012, U.S. Appl. No. 13/210,303, filed Aug. 15, 2011.

Office Action dated Apr. 10, 2012, U.S. Appl. No. 13/325,726, filed Dec. 14, 2011.

Office Action dated Feb. 24, 2012, U.S. Appl. No. 13/304,075, filed Nov. 23, 2011.

Foreign Communication From a Related Counterpart Application—International Search Report and Written Opinion, PCT/US2011/046955, Dec. 27, 2011.

Foreign Communication From a Related Counterpart Application—International Search Report and Written Opinion, PCT/US2011/061107, Jul. 28, 2011.

Foreign Communication From a Related Counterpart Application—International Search Report and Written Opinion, PCT/US2011/050395, Feb. 17, 2012.

Foreign Communication From a Related Counterpart Application—International Search Report and Written Opinion, PCT/US2011/049882, Feb. 20, 2012.

Foreign Communication From a Related Counterpart Application—International Search Report and Written Opinion, PCT/US2011/050401, Feb. 9, 2012.

"AutoLatchTM Release Gun Connector", Special Applications 6-7, Halliburton.

Baumann, Carlos, et al., "Perforating Wellbore Dynamics and Gunshock in Deepwater TCP Operations," Product Information Presentation, IPS-10-018, Schlumberger Reservoir Completions.

"Body Lock Ring", Mechanical Downhole Technology Transfer, Halliburton.

Canal, et al., "Predicting Pressure Behavior and Dynamic Shock Loads on Completion Hardware During Perforating," May 3-6, 2010.

"Downhole Mechanical Shock Absorber". Preliminary Report—patent and prior art search results, dated Jul. 8, 2010, Starboard Innovations, LLC.

"SXVA Explosively Initiated Vertical Shock Absorber", product paper 06-WT-066, Schlumberger, 2007.

Burleson, John D., et al., PCT Application entitled, "Modeling Shock Produced by Well Perforating," filed Dec. 17, 2010, Int'l Application No. PCT/US2010/061104.

Foreign Communication From a Related Counterpart Application—International Search Report and Written Opinion, PCT/US2011/034690, Oct. 27, 2011.

Foreign Communication From a Related Counterpart Application—International Search Report and Written Opinion, PCT/US2010/061104, Jul. 28, 2011.

"Accelerometer Wire Termination," IES, AN106.

Ager, Scott, IES "Fast Speed Gages," Power Point Presentation; Mar. 2, 2009, Navarre, FL, U.S.A.

Ager, Scott, "IES Housing and High Shock Considerations," Power Point Presentation.

Ager, Scott, "IES Introduction," Power Point Presentation, IES, U.S.A.

Ager, Scott, "IES Recorder Buildup," Power Point Presentation, U.S.A.

Ager, Scott, "Model 64 and 67 Buildup," Power Point Presentation, Oct. 17, 2006, U.S.A.

Ager, Scott, "IES Sensor Discussion," Power Point Presentation. U.S.A.

"Analog Recorder Test Example," http://www.iesrecorders.com/highschock.htm (last visited Sep. 1, 2010), IES Recorders-Highshock.

Ansah, Joseph et al., "Advances in Well Completion Design: A New 3D Finite-Element Wellbore Inflow Model for Optimizing Performance of Perforated Completions," Society of Petroleum Engineers, 2002.

"Battery Packaging for High Shock", IES, AN102.

(56) References Cited

OTHER PUBLICATIONS

Blakeborough, A. et al., "Novel Load Cell for Measuring Axial Force, Shear Force, and Bending Movement in Large-scale Structural Experiments," Experimental Mechanics, vol. 42, No. 1, p. 115-122, Mar. 2002.

Bruyere, Frederic et al., "New Practices to Enhance Perforating Results", Oilfield Review, p. 18-35, Autumn 2006.

"Casing Differential in PulsFrac™ Calculations," John F. Schatz Research and Consulting, Inc. 2004.

Cuthill, D.A. et al., "A New Technique for Rapid Estimation of Fracture Closure Stress When Using Propellants," SPE/ISRM 78171, Society of Petroleum Engineers, 2002.

Dobrilovic, Mario et al., "Measurements of Shock Wave Force in Shock Tube with Indirect Methods," Rudarsko-geolosko-naftni zbornik, vol. 17, 2005. University of Zagreb; Zagreb, Croatia.

"Ecrin Dynamic Flow Analysis Platform," http://www.essca.com/en/ecrin_en.asp (last visited Oct. 28, 2010) ESSCA, 2009.

"Electronic Initiation System," Special Devices, Inc., http://www.specialdevices.com/mining.htm (last visited May 18, 2011) Mesa, AZ, U.S.A.

"Fast Gauge Recorder," Perforating Solutions 5-110, Halliburton.

Furui, Kenji, "A Comprehensive Skin Factor Model for Well Completions Based on Finite Element Simulations," University of Texas at Austin, 2004.

Grove, B. et al., "Explosion-induced damage to oilwell perforating gun carriers," Structures Under Shock and Impact IX, WIT Transactions on The Built Environment, vol. 87, p. 165-176, WIT Press, 2006.

Grove, B. et al., "New Effective Stress Law for Predicting Perforation Depth at Downhole Conditions," SPE 111778, Society of Petroleum Engineers, 2008.

"Integrated Production Modeling Brochure," Petroleum Experts Ltd., 2008.

Jin, Quiankun et al., "3D Numerical Simulations of Penetrations of Oil-Well Perforator into Concrete Targets," 7th International LS-DYNA Users Conference, Beijing Engineering Software Technology Co., Ltd., Beijing, China.

Li, W et al., "The effect of annular multi-point initiation on the formation and penetration of an explosively formed penetrator," International Journal of Impact Engineering, 2009, doi:10.1016/j.ijimpeng.2009.08.008.

Murilo, Sergio et al., "Optimization and Automation of Modeling of Florw in Perforated Oil Wells," Virtual Product Development Conference, 2004. MSC Software, Huntingon Beach, California, U.S.A.

Ouyang, Liang-Biao et al., "Case Studies for Improving Completion Design Through Comprehensive Well-Performance Modeling," SPE 104078, Society of Petroleum Engineers, 2006.

Ouyang, Liang-Biao et al., "Uncertainty Assessment on Well-Performance Prediction for an Oil Producer Equipped With Selected Completions," SPE 106966, Society of Petroleum Engineers, 2007.

"Perf Breakdown, Fracturing, and Cleanup in PulsFrac®," John F. Schatz Research and Consulting, Inc., May 2, 2007.

"Petroleum Exploration & Production Software, Training & Consulting," v4.12-B, KAPPA Engineering, Jan. 2010.

"Positioning Strain Gages to Monitor Bending, Axial, Shear, and Torsional Loads," Strain Gages E.

"Problems in High-shock Management," Endevco, MEGGITT.

Proett, M.A. et al., "Productivity Optimization of Oil Wells Using a New 3D Finit-Element Wellbore Inflow Model and Artificial Neural Network," Halliburton Energy Services, Inc.

"PulsFrac™ Summary Technical Description", John F. Schatz Research and Consulting, Inc., 2004.

"PulsFrac™ Validation: Owen/HTH Surface Block Test," John F. Schatz Research and Consulting, Inc., 2004.

Regalbuto, J.A. et al., "Computer Codes for Oilwell-Perforator Design," Halliburton Explosive Products Center, SPE Drilling & Completion, Sep. 1997, p. 188-195, Halliburton Energy Services, Inc.

Rudshaug, Terje et al., "NETool™ a toolbox for Improved Reservoir Management," FORCE AWTC Seminar—Advanced Wells—Lessons Learned (application experience) and Future Directions/Opportunities, Apr. 21-22, 2004, DPT US, Inc.

Schatz, J.F. et al., "High-Speed Downhole Memory Recorder and Software Used to Design and Confirm Perforating/Propellant Behavior and Formation Fracturing," Society of Petroleum Engineers,Inc., 1999.

Schatz, J.F. et al., "High-Speed Pressure and Accelerometer Measurements Characterize Dynamic Behavior During Perforating Events in Deepwater Gulf of Mexico," SPE 90042, Society of Petroleum Engineers, 2004.

Schatz, John, "The Role of Compressibility in PulsFrac® Software," John F. Schatz Research and Consulting, Inc., Aug. 22, 2007.

"Series 200 High Shock, High Speed Pressure and Acceleration Gauge", IES, Instrumentation and Engineering Services Inc., Aug. 2004, U.S.A.

"Series 300 Gauge," http://www.iesrecorderes.com/oilwell.htm (last visited Sep. 1, 2010), IES Recorders-Oil Well.

"Series 300 High Shock, High Speed Pressure Gauge", Instrumentation and Engineering Services Inc., Feb. 2010, Navarre, FL, U.S.A.

Shepherd, Joseph E., "Structural Response of Piping to Internal Gas Detonation," Proceedings of PVP2006-ICPVT-11, 2006 ASME Pressure Vessels and Piping Division Conference, Jul. 23-27, 2006, Vancouver BC, Canada.

"ShockPro Shockload Evaluation Service—Engineer Perforated Completions to Evaluate the Mechanical Integrity of All System Components," Wireline and Perforating Services, Halliburton Energy Services, Inc.

"ShockPro Shockload Evaluation Service" Perforating Solutions 5-125, Halliburton Energy Services, Inc.

"Simulation Software for EquiFlow® ICD Completions," Advanced Completions, HO7010, Halliburton, Sep. 2009.

"WEM—Well Evaluation Model," P.E. Moseley & Associates, Inc., Houston, TX U.S.A.

Patent Application entitled "Perforating Gun with Internal Shock Mitigation," filed Jun. 11, 2012, U.S. Appl. No. 13/493,327 (Smith IP).

Office Action dated Sep. 6, 2012, U.S. Appl. No. 13/495,035, filed Jun. 13, 2012, (Smith IP).

"2010 International Perforating Symposium", Agenda, dated May 6-7, 2010 2 pages.

Glenn, Timothy S., et al., Patent Application entitled, "Shock Load Mitigation in a Downhole Perforation Tool Assembly," filed Aug. 25, 2012, U.S. Appl. No. 13/594,776.

Rodgers, John P., et al., Patent Application entitled "Perforating Gun with Internal Shock Mitigation", filed Jun. 26, 2012, U.S. Appl. No. 13/533,600.

Rodgers, John P., et al., Patent Application entitled, "Perforating String with Longitudinal Shock De-Coupler", filed Jun. 13, 2012, U.S. Appl. No. 13/495,035.

Rodgers, John P., et al., Patent Application entitled, "Perforating String with Bending Shock De-Coupler", filed Dec. 14, 2011, U.S. Appl. No. 13/325,909.

Final Office Action dated Aug. 2, 2012, U.S. Appl. No. 13/210,303, filed Aug. 15, 2011 (Smith IP).

Final Office Action dated Jul. 26, 2012, U.S. Appl. No. 13/325,726, filed Dec. 14, 2011 (Smith IP).

Office Action dated Jun. 29, 2012, U.S. Appl. No. 13/325,866, filed Dec. 14, 2011.

Office Action dated Jun. 6, 2012, U.S. Appl. No. 13/325,909, filed Dec. 14, 2011.

Rodgers, John P., et al., PCT Application entitled "Sensing Shock During Well Perforation", filed Dec. 17, 2010, App. No. PCT/US10/66102.

Glenn, Timothy S., et al., Patent Application entitled, "Shock Load Mitigation in a Downhole Perforation Tool Assembly", filed May 15, 2013, U.S. Appl. No. 13/895,032.

Rodgers, John P., et al. PCT Application entitled, "Perforation Gun String Energy Propagation Management System and Methods", filed Sep. 19, 2012, Int'l Application No. PCT/US12/56165.

Rodgers, John P., et al., PCT Application entitled, "Perforation Gun String Energy Propagation Management with Tuned Mass Damper", filed Sep. 19, 2012, Int'l Application No. PCT/US12/56164.

(56) References Cited

OTHER PUBLICATIONS

Martinez, Samuel, et al., PCT Application entitled, "Shock Attenuator for Gun System", filed Apr. 3, 2012, Int'l Application No. PCT/US12/32004.
Martinez, Samuel, et al., Patent Application entitled, "Shock Attenuator for Gun System", filed Mar. 4, 2013, U.S. Appl. No. 13/820,748.
Rodgers, John P., et al., Patent Application entitled "Sensing Shock During Well Perforating", filed Nov. 23, 2011, U.S. Appl. No. 13/304,075.
Restriction Requirement dated Jan. 31, 2013, U.S. Appl. No. 13/594,776, filed Aug. 25, 2012.
Office Action dated Mar. 26, 2013, U.S. Appl. No. 13/594,776, filed Aug. 25, 2012.
Notice of Allowance dated Jul. 11, 2013, U.S. Appl. No. 13/594,776, filed Aug. 25, 2012.
Office Action dated Apr. 4, 2013, U.S. Appl. No. 13/210,303, filed Aug. 15, 2011.
Office Action dated Oct. 1, 2012, U.S. Appl. No. 13/325,726, filed Dec. 14, 2011.
Notice of Allowance dated Jan. 23, 2013, U.S. Appl. No. 13/325,726, filed on Dec. 14, 2011.
Final Office Action dated Oct. 23, 2012, U.S. Appl. No. 13/325,866, filed Dec. 14, 2011.
Notice of Allowance dated Jan. 24, 2013, U.S. Appl. No. 13/325,866, filed Dec. 14, 2011.
Final Office Action dated Dec. 14, 2012, U.S. Appl. No. 13/495,035.
Notice of Allowance dated Feb. 15, 2013, U.S. Appl. No. 13/495,035.
Final Office Action dated Nov. 19, 2012, U.S. Appl. No. 13/325,909, filed Dec. 14, 2011.
Notice of Allowance dated Feb. 1, 2013, U.S. Appl. No. 13/325,909, filed Dec. 14, 2011.
Office Action dated Dec. 18, 2012, U.S. Appl. No. 13/533,600, filed Jun. 26, 2012.
Final Office Action dated Jun. 20, 2013, U.S. Appl. No. 13/533,600, filed Jun. 26, 2012.
Office Action dated Dec. 12, 2012, U.S. Appl. No. 13/493,327, filed Jun. 11, 2012.
Final Office Action dated Jun. 11, 2013, U.S. Appl. No. 13/493,327, filed Jun. 11, 2012.
Foreign Communication from a Related Counterpart Application, International Search Report and Written Opinion dated Apr. 10, 2013, International Application PCT/US12/56165 filed on Sep. 19, 2012.
Foreign Communication from a Related Counterpart Application, International Search dated Apr. 5, 2013, International Application PCT/US12/56164 filed Sep. 19, 2012.
Rodgers, John P., et al., Patent Application entitled, "Perforation Gun String Energy Propagation Management System and Methods", filed Sep. 11, 2013, U.S. Appl. No. 14/004,678.
Rodgers, John P., et al., Patent Application entitled, "Perforation Gun String Energy Propagation Management with Tuned Mass Damper", filed Sep. 5, 2013, U.S. Appl. No. 14/003,234.
Rodgers, John P., et al., Patent Application entitled, "Perforation Gun String Energy Propagation Management with Tuned Mass Damper", filed Sep. 18, 2013, U.S. Appl. No. 14/031,034.
Notice of Allowance dated Oct. 2, 2013, U.S. Appl. No. 13/594,776, filed Aug. 25, 2012.
Office Action dated Sep. 30, 2013, U.S. Appl. No. 13/895,032, filed May 15, 2013.
Final Office Action dated Sep. 13, 2013, U.S. Appl. No. 13/210,303, filed Aug. 15, 2011.

* cited by examiner

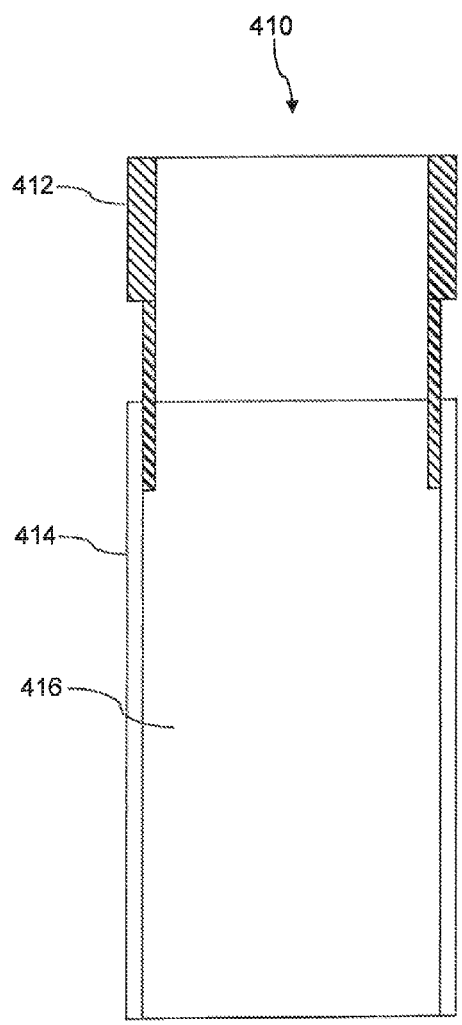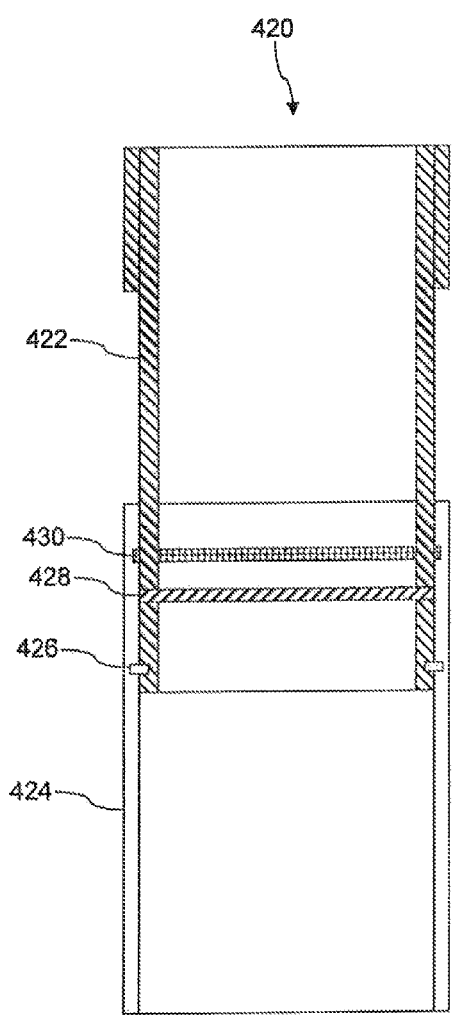
FIG. 11
FIG. 12

US 8,881,816 B2

SHOCK LOAD MITIGATION IN A DOWNHOLE PERFORATION TOOL ASSEMBLY

CROSS-REFERENCE TO RELATED APPLICATIONS

This application claims priority to PCT International Application No. PCT/US2011/034690, filed Apr. 29, 2011 and entitled "Shock Load Mitigation in a Downhole Perforation Tool Assembly," which is incorporated herein by reference in its entirety for all purposes.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Wellbores are drilled into the earth for a variety of purposes including tapping into hydrocarbon bearing formations to extract the hydrocarbons for use as fuel, lubricants, chemical production, and other purposes. When a wellbore has been completed, a metal tubular casing may be placed and cemented in the wellbore. Thereafter, a perforation tool assembly may be run into the casing, and one or more perforation guns in the perforation tool assembly may be activated and/or fired to perforate the casing and/or the formation to promote production of hydrocarbons from selected formations. Perforation guns may comprise one or more explosive charges that may be selectively activated, the detonation of the explosive charges desirably piercing the casing and penetrating at least partly into the formation proximate to the wellbore.

SUMMARY

In an embodiment, a perforation tool assembly is disclosed. The perforation tool assembly comprises an energy train, a first perforation gun, and a second perforation gun. The energy train comprises a moderator to reduce the speed of propagation of a detonation in a direction parallel to the axis of the perforation tool assembly. The first perforation gun comprises a plurality of explosive charges coupled to a first portion of the energy train. The second perforation gun comprises a plurality of explosive charges coupled to a second portion of the energy train, wherein the second portion of the energy train is coupled to the first portion of the energy train.

In an embodiment, a method of perforating a wellbore is provided. The method comprises analyzing a speed of propagation of a shock wave through a tool body of a perforation tool assembly and analyzing a speed of detonation propagation in an energy train in a direction parallel to an axis of the tool body of the perforation tool assembly. The perforation tool assembly comprises a plurality of explosive charges. The method further comprises designing the perforation tool assembly, based on analyzing the speed of propagation of the shock wave and analyzing the speed of detonation propagation, to mitigate a shock load associated with an interaction between detonation of the explosive charges, building the perforation tool assembly based on the perforation tool assembly design, and perforating the wellbore by firing the perforation tool assembly.

In another embodiment, a downhole perforation tool assembly is provided. The perforation tool assembly comprises a first perforation gun, a second perforation gun, and an electrical conductor. The first perforation gun comprises a first plurality of explosive charges and a first electrically actuated detonation initiator, wherein the first electrically actuated detonation initiator is coupled to at least one of the first plurality of explosive charges. The second perforation gun is mechanically coupled to the first perforation gun and comprises a second plurality of explosive charges and a second electrically actuated detonation initiator, wherein the second electrically actuated detonation initiator is coupled to at least one of the second plurality of explosive charges. The electrical conductor is coupled to the first and second electrically actuated detonation initiators. The first and second electrically actuated detonation initiators actuate in response to an electrical signal conveyed by the electrical conductor to detonate the first plurality of explosives and the second plurality of explosive charges respectively. The timing of the actuating of the first and the second electrically actuated detonation initiators is controlled to mitigate a shock load in the perforation tool assembly associated with an interaction between the detonations of the first and second plurality of explosives.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

FIG. 11 is an illustration of a hydraulic shock absorber according to an embodiment of the disclosure.

FIG. 12 is an illustration of a decoupler according to an embodiment of the disclosure.

DETAILED DESCRIPTION

Figure 1:
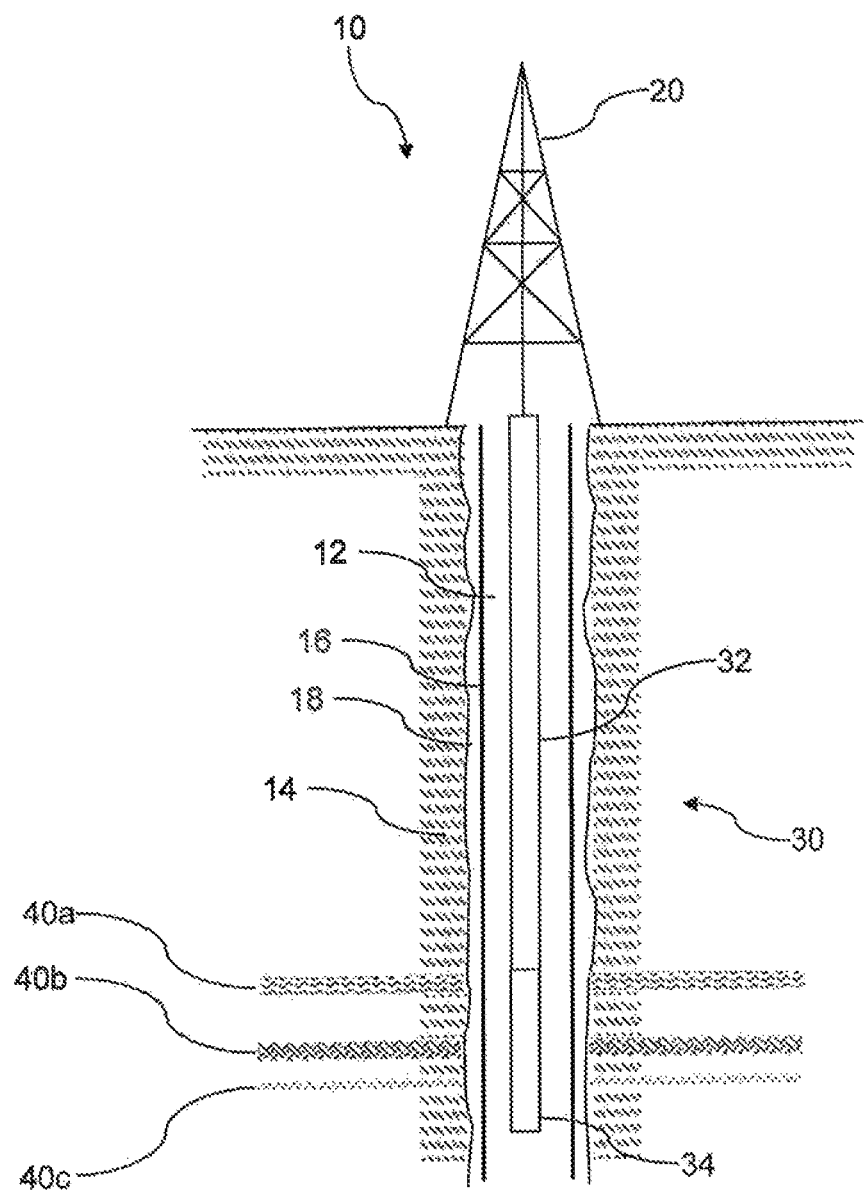
FIG. 1 is an illustration of a wellbore and workstring according to an embodiment of the disclosure.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

In recent downhole wellbore servicing practice, perforation tool assemblies have featured increasing numbers of explosive charges, and the overall length of the perforation tool assemblies has increased. Along with this evolution, new problems have been experienced during wellbore servicing operations. These problems may include perforation tool assemblies that separate, leaving a portion of the perforation tool assembly in the wellbore when the workstring is removed from the wellbore after firing the perforation guns. The perforation tool assembly and/or workstring may buckle, deform, or yield. The perforation tool assembly and/or workstring may fail in compression or in a corkscrew buckling mode. In some failures, the perforation tool assembly and/or workstring may become stuck in the wellbore. A packer in the workstring and/or tubing above the perforation tool assembly may be damaged. Yet other failure modes may be experienced. These problems may entail time consuming and expensive fishing operations to capture and retrieve portions of the perforation tool assembly that parted. These problems may delay placing the wellbore on production, thereby incurring financial losses. In a worst case scenario, the wellbore may be lost entirely.

It is a teaching of the present disclosure that, in some cases, the cause of these problems experienced during the course of perforating the wellbore may be ascribed to an accumulation of energy in a shock wave, a shock wave peak, and/or a shock load that propagates in a tool body of the perforation tool assembly. This may be referred to as an amplification or accumulation of the shock load in a tool body of the perforation tool assembly. As used herein, the term shock load may have a variety of meanings. One meaning is to refer to a mechanical stress caused by detonation of one or more explosive charges that is applied as a force on the perforation tool assembly and/or workstring. To some extent, most of the shock load may comprise a force directed parallel to an axis of the perforation tool assembly and/or workstring. This stress may be applied both downhole and uphole parallel to the axis of the perforation tool assembly and/or workstring. It is understood that in some circumstances, the perforation tool assembly and/or workstring may be curved or arced over one or more segments. In this circumstance, the expression "parallel to an axis" is understood to mean tangent to the arc of the perforation tool assembly and/or workstring at the point of interest. Notwithstanding, a portion of the stress may be directed in other directions such as radial to the perforation tool assembly and/or workstring.

As explosive charges in the perforation guns are detonated, some of the energy released by the detonation propagates in the tool body of the perforation tool assembly, parallel to the axis of the perforation tool assembly. If the activation of the explosive charges progresses parallel to the axis of the perforation gun assembly at about the same speed that the shock wave propagates in the tool body, the energy in the shock wave can accumulate and/or build with each successive detonation, amplifying the shock load. In an embodiment, the shock wave may travel down the perforation tool assembly in a compression wave, reflect off the end of the perforation tool assembly, and travel back up the perforation tool assembly as a tensile wave. Some failure modes may be associated with compression waves, and other failure modes may be associated with tensile waves. While descriptions herein refer to a top to bottom detonation sequence of explosive charges and/or perforation guns, it is understood that other detonation sequences are consistent with the present disclosure.

A method and apparatus for mitigating a shock load in a perforation tool assembly is taught herein. In an embodiment, the shock load may be mitigated by offsetting the speed of propagation of a shock wave generated by detonation of explosive charges in the perforation tool assembly and the speed of propagation of the activating energy train parallel to the axis of the perforation tool assembly. A variety of embodiments for offsetting speeds are described in detail hereinafter. Some of these embodiments include slowing a propagation of an energy train in the perforation tool assembly by extending the path of the energy train, modifying the detonation cord to reduce its speed of detonation, and incorporating a bullet firing gun into the energy train. Some embodiments include speeding the propagation of the energy train by using an electrical signal as the energy train. Some embodiments include slowing the propagation of the shock wave in the perforation tool assembly by using a composite material for a portion of the perforation tool assembly. In another embodiment, the shock load may be mitigated by incorporating energy absorber structures and/or decouplers into the perforation tool assembly. Again, a variety of embodiments are described further hereinafter. Energy absorbers may slow or delay the propagation of the shock wave and may include deformable energy absorbers, shock absorbers, and mass energy absorbers. Additionally, decouplers may be employed to attenuate the propagation of shock wave energy across the decouplers.

Unless otherwise specified, any use of any form of the terms "connect," "engage," "couple," "attach," or any other term describing an interaction between elements is not meant to limit the interaction to direct interaction between the elements and may also include indirect interaction between the elements described. In the following discussion and in the claims, the terms "including" and "comprising" are used in an open-ended fashion, and thus should be interpreted to mean "including, but not limited to . . . ". Reference to up or down will be made for purposes of description with "up," "upper," "upward," or "upstream" meaning toward the surface of the wellbore and with "down," "lower," "downward," or "downstream" meaning toward the terminal end of the well, regardless of the wellbore orientation. The term "zone" or "pay zone" as used herein refers to separate parts of the wellbore designated for treatment or production and may refer to an entire hydrocarbon formation or separate portions of a single formation such as horizontally and/or vertically spaced portions of the same formation. The various characteristics mentioned above, as well as other features and characteristics described in more detail below, will be readily apparent to those skilled in the art with the aid of this disclosure upon reading the following detailed description of the embodiments, and by referring to the accompanying drawings.

Turning now to FIG. 1, a wellbore servicing system 10 is described. The system 10 comprises servicing rig 20 that extends over and around a wellbore 12 that penetrates a subterranean formation 14 for the purpose of recovering hydrocarbons from a first production zone 40a, a second production zone 40b, and/or a third production zone 40c. The wellbore 12 may be drilled into the subterranean formation 14 using any suitable drilling technique. While shown as extending vertically from the surface in FIG. 1, in some embodiments the wellbore 12 may be deviated, horizontal, and/or curved over at least some portions of the wellbore 12. The wellbore 12 may be cased, open hole, contain tubing, and may generally comprise a hole in the ground having a variety of shapes and/or geometries as is known to those of skill in the art. In an embodiment, a casing 16 may be placed in the wellbore 12 and secured at least in part by cement 18.

The servicing rig 20 may be one of a drilling rig, a completion rig, a workover rig, or other mast structure and supports a workstring 30 in the wellbore 12, but in other embodiments a different structure may support the workstring 30. In an embodiment, the servicing rig 20 may comprise a derrick with a rig floor through which the workstring 30 extends downward from the servicing rig 20 into the wellbore 12. In some embodiments, such as in an off-shore location, the servicing rig 20 may be supported by piers extending downwards to a seabed. Alternatively, in some embodiments, the servicing rig 20 may be supported by columns sitting on hulls and/or pontoons that are ballasted below the water surface, which may be referred to as a semi-submersible platform or rig. In an off-shore location, a casing may extend from the servicing rig 20 to exclude sea water and contain drilling fluid returns. It is understood that other mechanical mechanisms, not shown, may control the run-in and withdrawal of the workstring 30 in the wellbore 12, for example a draw works coupled to a hoisting apparatus, a slickline unit or a wireline unit including a winching apparatus, another servicing vehicle, a coiled tubing unit, and/or other apparatus.

In an embodiment, the workstring 30 may comprise a conveyance 32 and a perforation tool assembly 34. The conveyance 32 may be any of a string of jointed pipes, a slickline, a coiled tubing, and a wireline. In another embodiment, the workstring 30 may further comprise one or more downhole tools (not shown), for example above the perforation tool assembly 34. The workstring 30 may comprise one or more packers, one or more completion components such as screens and/or production valves, sensing and/or measuring equipment, and other equipment which are not shown in FIG. 1. In some contexts, the workstring 30 may be referred to as a tool string. The workstring 30 may be lowered into the wellbore 12 to position the perforation tool assembly 34 to perforate the casing 16 and penetrate one or more of the production zones 40.

Figure 2:
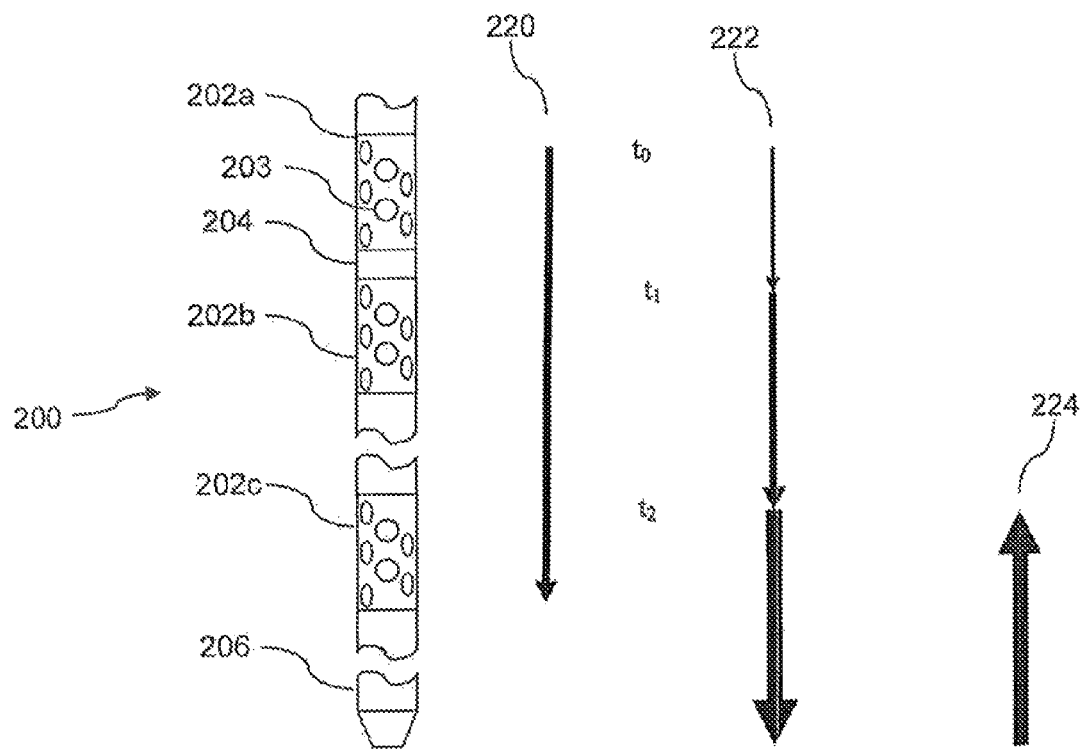
FIG. 2 is an illustration of a perforation tool assembly according to an embodiment of the disclosure.

Turning now to FIG. 2, a perforation tool assembly 200 is described. In an embodiment, the perforation tool assembly 200 comprises a plurality of perforation guns 202 optionally interconnected by one or more spacers 204 and terminated by a foot 206. While the perforation tool assembly 200 is illustrated in FIG. 2 as comprising a first perforation gun 202a, a second perforation gun 202b, and a third perforation gun 202c, it is understood that the perforation tool assembly 200 may comprise any number of perforation guns 202. Each perforation gun 202 comprises one or more explosive charges 203 that desirably perforate the casing 16 and the subterranean formation 14 when the perforation gun 202 is activated and/or fired. The perforation tool assembly 200 may further comprise a firing head (not shown) that initiates a detonation train and/or an energy train to fire the perforation guns 202. The perforation tool assembly 200 may further comprise tandems (not shown) that are used to promote coupling between perforation guns 202, spacers 204, and/or other components in the perforation tool assembly 200. In an embodiment, the perforation tool assembly 200 may comprise one or more structures for altering the shock wave that propagates through the perforation tool assembly 200 in response to the perforation guns 202 being fired, thereby attenuating the shock wave associated with the interaction between the shock wave propagation and energy train propagation parallel to the axis of the perforation tool assembly 200.

The explosive charges 203 may be shaped charges that focus energy in a preferred direction, for example radially outwards. The explosive charges 203 may be designed to have a relatively unfocused energy projection to produce big, shallow holes in the subterranean formation 14, which may be referred to in some contexts as big hole charges. Alternatively, the explosive charges 203 may be designed to provide highly focused energy projections to produce narrower, deeper penetrations into the subterranean formation 14, which may be referred to in some contexts as deep penetrating charges. In some embodiments, both big hole charges and deep penetrating charges may be mixed in the perforating tool assembly 200 in various ways. For example, one perforation gun 202 may comprise all big hole charges, and another perforation gun 202 may comprise all deep penetrating charges. Alternatively, in an embodiment, the perforation gun 202 may comprise both big hole charges and deep penetrating charges.

The spacers 204 may be incorporated in the perforation tool assembly 200 to align the perforation guns 202 desirably with different production zones 40. For example, it may be desirable to penetrate the casing 16 to produce from a first zone at between 10200 feet and 10230 feet, to penetrate the casing 16 to produce from a second zone at between 10360 feet and 10380 feet, and to penetrate the casing 16 to produce from a third zone at between 10460 feet and 10480 feet. In this case, a first spacer 130 feet in length may be incorporated between the first perforation gun 202a and a second spacer 80 feet in length may be incorporated between the second perforation gun 202b and the third perforation gun 202c. The spacers 204 may comprise a plurality of connected pipes and/or tubular bodies.

In an embodiment, the charges 203 in the perforation guns 202 are detonated by the propagation of an energy train 220 directed downwards and parallel to the axis of the perforation tool assembly 200. In this case, the first perforation gun 202a is activated by the energy train 220 first, the second perforation gun 202b is activated by the energy train 220 second and after the first perforation gun 202a is activated, and the third perforation gun 202c is activated by the energy train 220 third and after the second perforation gun 202b is activated. Assuming that the speed of propagation of the energy train 220 parallel to the axis of the perforation tool assembly 200 is approximately equal to the speed of propagation of a shock wave traveling in a tool body of the perforation tool assembly 200, for example a steel tool body, as each successive perforation gun 202 is fired, a shock wave 222 is created in the perforation tool assembly 200 that propagates downwards and adds to or accumulates with the amplitude of the shock wave already propagating downwards from the previously fired perforation gun 202. The graphic arrows depicting the shock wave 222 conceptually represent this building and/or accumulating amplitude of the shock wave as increasingly thick arrows. Note that the explosion of the charges 203 also creates shock waves that propagate up the tool body and up the work string 30, but the these shock waves do not overlap in time and hence do not accumulate in amplitude. When the shock wave 222, which is compressive as it travels downwards, reaches the foot 206 of the perforation tool assembly 200 it reflects back upwards as a tensile shock wave 224.

It is understood that in other embodiments, the perforation guns 202 may be detonated by the propagation of an energy train 220 directed upwards such that the third perforation gun 202c is activated by the energy train 220 first, the second perforation gun 202b is activated by the energy train 220 second and after the third perforation gun 202c is activated, and the first perforation gun 202a is activated by the energy train 220 third and after the second perforation gun 202b is activated. A shock analysis similar to that for firing from top to bottom can be performed for this firing sequence as well as for other firing sequences, for example where the energy train 220 is first activated between perforation guns 202 and propagates both upwards and downwards at the same time.

The structures that alter the propagation of the shock wave may be incorporated into the perforation tool assembly 200, for example to attenuate the magnitude of the shock wave, to change the speed of the shock wave, to change the timing of the shock wave, or to tune the dynamic response of the perforation tool assembly 200 to reduce the shock load on the perforation tool assembly 200. Some of the structures may promote an acoustic impedance mismatch with the remainder of the perforation tool assembly 200 such that some of the shock wave energy is reflected, thereby attenuating the shock wave energy that is propagated in the direction of detonation propagation. The structures may comprise one or more energy mass absorbers where a mass is suspended within a segment of tubing with energy absorbing elements supporting the mass on either end. When subjected to a large acceleration, for example when the shock wave accelerates the segment of tubing enclosing the mass, the large inertia of the mass resists motion, thus imparting a load on the energy absorber elements supporting the mass. The energy absorbed by the energy absorbing material, for example crushable structures, removes energy from the shock wave. The structures may comprise a deformable energy absorber having non-linear elasticity. This deformable energy absorber may flex very little in response to shock loads up to a threshold level and then, for shock loads above this threshold, yield readily. This may be modeled as a non-linear spring where the spring exhibits a first spring constant during a first range of force input and a second spring constant over a second range of force input. The structures may comprise a hydraulic shock absorber that attenuates the shock load. The structures may comprise a decoupler that interrupts the propagation of most of the shock wave through the perforation tool assembly 200.

Figure 3:
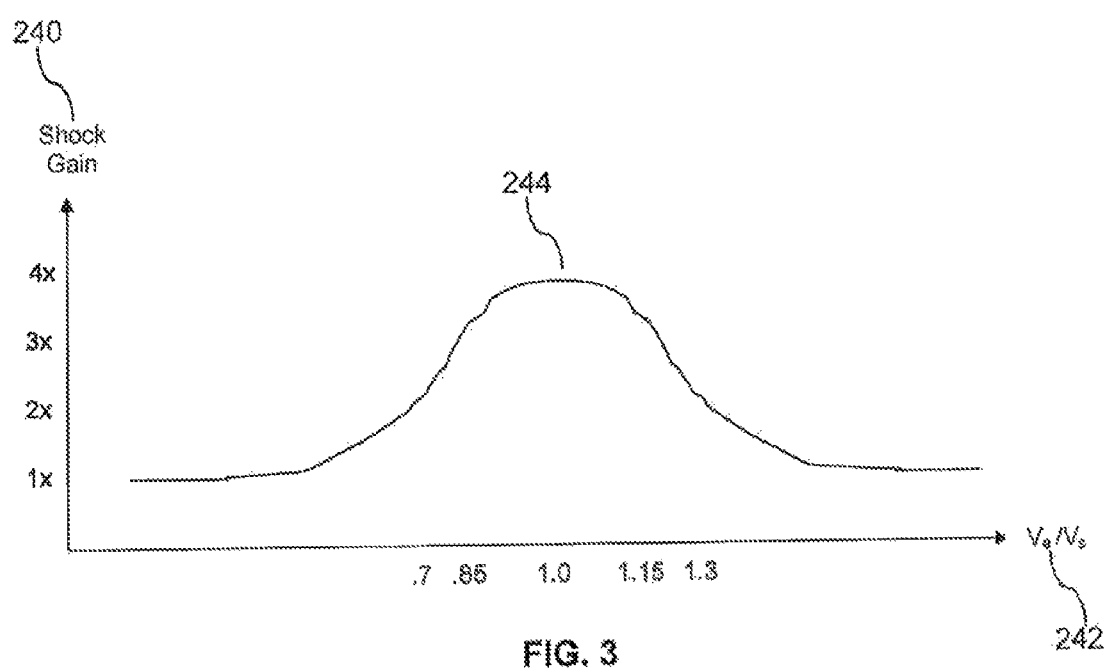
FIG. 3 is an illustration of an exemplary shock load function according to an embodiment of the disclosure.

Turning now to FIG. 3, a shock amplification 240 is represented as a function of a ratio $V_e/V_s$ 242 of a speed of the energy train propagation in the direction parallel to the axis of the perforation tool assembly 200, $V_e$, to a speed of the shock wave propagation in the tool body in the direction parallel to the axis of the perforation tool assembly 200, $V_s$. When $V_e$ is substantially less than $V_s$ or substantially greater than $V_s$, the shock waves associated with the detonation of the charges in the perforation guns 202 do not align sufficiently to significantly boost the amplitude of the shock wave. When $V_e$ and $V_s$ approach each other, however, the shock waves associated with the detonation of the charges in the perforation guns 202 begin to accumulate in magnitude, an effect which may be referred to as shock amplification. The shock amplification 240 may be mapped to a shock load which may be quantified in units of force.

It is understood that the function depicted in FIG. 3 is exemplary and that in different specific implementations of the perforation tool assembly 200, a different relationship between the ratio $V_e/V_s$ 242 and the shock amplification 240 may be applicable. The maximum amplitude gain 244 may depend upon the number of charges 203 that are exploded—more charges being generally associated with a greater maximum amplitude gain 244. Additionally, the maximum amplitude gain 244 may further depend on the elasticity of the tool body and/or the extent to which the energy in the shock wave is dissipated and/or decays in the tool body. A shock load imparted by exploding charges may initially have a short duration, high amplitude but may become spread out in time as a lower amplitude, longer duration wave as the shock wave propagates in the tool body. The present disclosure teaches reducing the shock amplification 240 by offsetting the values of $V_e$ and V. This can be done by increasing or decreasing $V_e$ and/or by decreasing or increasing $V_s$.

To motivate and illustrate adapting the ratio of $V_e/V_s$, the following example is provided. The energy train in the perforation tool assembly 200 may comprise detonation cord that detonates at a rate of about 22000 feet per second. The perforation tool assembly 200 may comprise three perforation guns 202 each 10 feet long and two spacers 204 each 10 feet long. The energy train may route through the spacers 204 by substantially a straight path and thus the energy train propagation speed parallel to the axis of the perforation tool assembly 200 through each of the spacers 204 may be about 22000 feet per second. The energy train may route through the three perforation guns 202 by a zig-zag path at an energy train propagation speed parallel to the axis of the perforation tool assembly 200 of about 14500 feet per second. The average energy train propagation speed parallel to the axis of the perforation tool assembly 200 across the whole perforation tool assembly 200 may be calculated as about 17500 feet per second. Thus, in this example, $V_e$ is about 17500 feet per second. Further, assume that $V_s$ is about 17500 feet per second. Given these assumptions, the ratio of $V_e/V_s$ is about 1.0 which corresponds to a shock amplification of about 3.8 in FIG. 3.

To reduce the shock load, the design of the perforation tool assembly 200 may be altered to either increase or decrease the value of $V_e$. For this example, $V_e$ will be reduced. Assume that the energy train in each of the two spacers 204 is lengthened by 2.5 times so each spacer 204 comprises 25 feet of detonation cord. This corresponds to an energy train propagation speed parallel to the axis of the perforation tool assembly 200 of about 8800 feet per second. Combining these redesigned spacers with the previous perforation guns 202, the average energy train propagation speed parallel to the axis of the perforation tool assembly 200 across the whole perforation tool assembly 200 may be calculated as about 12250 feet per second. Given these assumptions, the ratio of $V_e/V_s$ is about 0.7 which corresponds to the maximum shock amplification of about 2.0 in FIG. 3. It is understood that other embodiments of the perforation tool assembly 200 are contemplated by the present disclosure and different values may apply in these other embodiments.

The specific parameter values used in this example case were chosen for their convenience and tractability and may not correspond with lengths of perforation guns 202 and/or spacers 204. Additionally, it is also understood that another solution may be adopted based on increasing the value of $V_e$, for example by using high speed detonation cord and/or making the energy train path through the perforation guns 202 more direct and less of a zig-zag.

In the example above, the ratio of $V_e/V_s$ was calculated with reference to a point just below the third perforation gun 202c, but it is understood $V_e/V_s$ may be calculated as desired at any point along the perforation gun assembly 200 to analyze the shock load and/or the shock load at that point. Additionally, the analysis of shock load may be determined over sub-segments of the perforation tool assembly 200. Additionally, it is understood that other parameters affect the shock load, for example the number of explosive charges 203 that may have been fired above the reference point along the perforation gun assembly 200.

Figure 4:
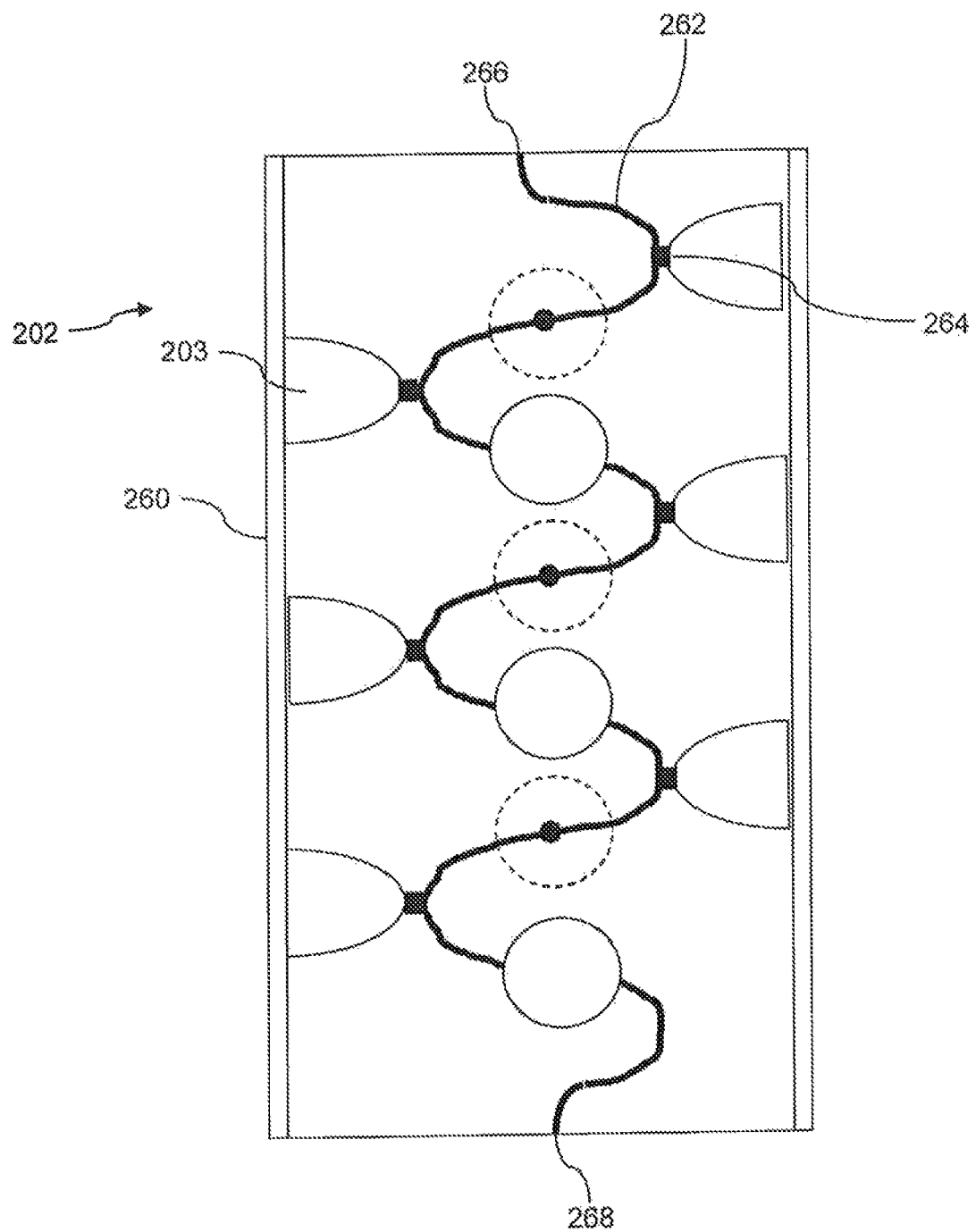
FIG. 4 is an illustration of a perforation gun according to an embodiment of the disclosure.

Turning now to FIG. 4, an embodiment of the perforation gun 202 is described. The perforation gun 202 comprises a tool body 260 and a plurality of explosive charges 203 coupled to a detonation cord 262 by a detonation coupler 264.

The detonation cord 262 provides the segment of the energy train of the perforation gun 202. In an embodiment, the explosive charges may be retained in a charge holder (not shown) that nests within the tool body 260. The perforation gun 202 may further comprise coupling structures (not shown), e.g., threaded couplings, to connect to other perforation guns 202, to spacers 204, and/or to foot 206. In an embodiment, the detonation cord 262 has an upper end 266 that may couple to an energy train upwards of the perforation gun 202 and a lower end 268 that may couple to an energy train downwards of the perforation gun 202. In an embodiment, the ends 266, 268 may comprise explosive boosters that promote coupling the energy train between subassemblies of the perforation tool assembly 200, for example between the perforation gun 202 and the spacer 204. When a detonation propagates down the energy train to the upper end 266 of the detonation cord 262, the detonation cord 262 propagates detonation to each of the detonation couplers 264 in sequence, and each of the detonation couplers 264 propagates detonation to the explosive charge 203 to which it is attached, thereby detonating the explosive charge 203.

Detonation may propagate in standard detonation cord at about 22000 feet per second. Detonation may propagate in high speed detonation cord at about 24000 feet per second. In some embodiments, the explosive charges 203 may be located in close proximity to each other. For example, some of the charges may be separated by less than three inches. In an embodiment, the charges may be separated by less than one inch apart along the axis of the perforation tool assembly 200. Because it is desirable that each explosive charge 203 perform its function without being interfered with by adjacent charges, it is generally preferred that the detonation propagate in the detonation cord 262 as rapidly as possible, such that all explosive charges 203 in a perforation gun 202 detonate approximately simultaneously.

In an embodiment, however, the detonation cord 262 may be adapted to reduce the speed of energy train propagation through the perforation gun 202 parallel to the axis of the perforation gun 202, $V_e$, so as to mitigate the shock load described above with reference to FIG. 3 and to mitigate the risk that the tensile shock wave 224 described above with reference to FIG. 2 may damage the perforation tool assembly 200. This may also be referred to as mitigating the shock load in some contexts. In an embodiment, the speed of energy train propagation through the perforation gun 202 parallel to the axis of the perforation gun 202 may be reduced to achieve an overall reduction in speed of energy train propagation parallel to the axis of the perforation tool assembly 200, $V_e$, across the whole perforation tool assembly 200 by an amount in the range from 1% to 50% with reference to a design that uses standard detonation cord. For example, using the example described above with reference to FIG. 3, the 14500 feet per second speed of energy train propagation in the direction parallel to the axis of the perforation gun 202, considered across the entire perforation tool assembly 200, $V_e$, may be slowed by from 145 feet per second to 7250 feet per second, thereby resulting in a value of $V_e$ through the perforation tool assembly 200 in the range of from 14355 feet per second to 7250 feet per second.

Alternatively, in an embodiment, the speed of energy train propagation through the perforation gun 202 parallel to the axis of the perforation gun 202 may be reduced to achieve an overall reduction in speed of energy train propagation parallel to the axis of the perforation tool assembly 200, $V_e$, across the whole perforation tool assembly 200 by an amount in the range from 15% to 30% with reference to a design that uses standard detonation cord. For example, using the example described above with reference to FIG. 3, the 14500 feet per second speed of energy train propagation in the direction parallel to the axis of the perforation gun 202, considered across the entire perforation tool assembly 200, $V_e$, may be slowed by from 2175 feet per second to 4350 feet per second, thereby resulting in a value of $V_e$ through the perforation tool assembly 202 in the range of from 12325 feet per second to 10150 feet per second.

The detonation rate of the detonation cord 262 may be reduced in a variety of ways. The standard explosive composition of the detonation cord 262 may be diluted by adding inert or non-reactive material, for example sand or fine clay. The standard explosive composition of the detonation cord 262 may be diluted by mixing in a weaker or less energetic explosive compound. In some contexts, the alteration of the standard detonation cord may be referred to as a moderator.

Figure 5:
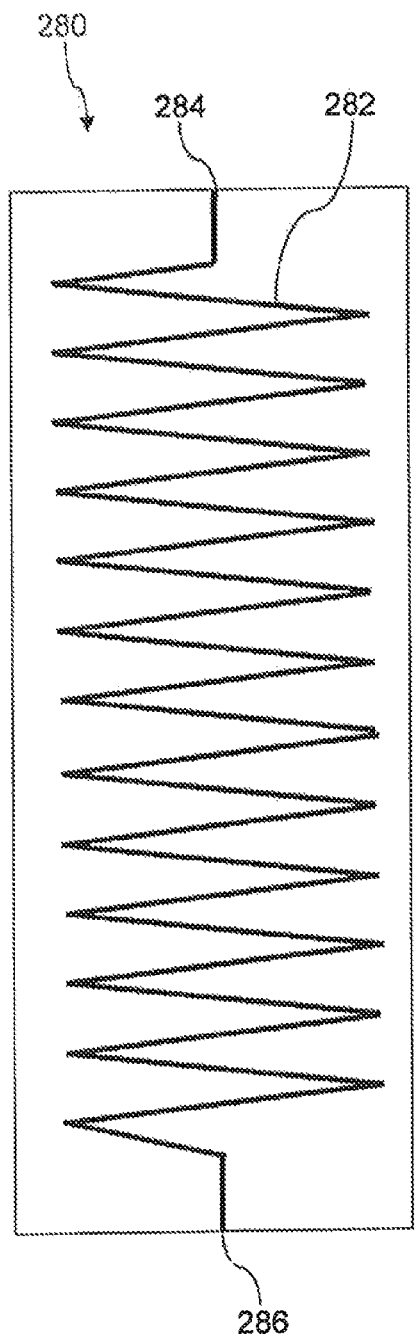
FIG. 5 is an illustration of a spacer according to an embodiment of the disclosure.

Turning now to FIG. 5, a spacer 280 is described. In an embodiment, the spacer 280 may be incorporated into the perforation tool assembly 200 between two perforation guns 202 and provides at least a portion of the energy train between the two perforation guns 202. The spacer 280 may further comprise coupling structures (not shown), e.g., threaded couplings, to connect to perforation guns 202, to other spacers 204, and/or to foot 206. The spacer 280 may comprise a detonation cord 282 having an upper end 284 that couples into the energy train above the spacer 280 and a lower end 286 that couples into the energy train below the spacer 280. In an embodiment, the ends 284, 286 may comprise explosive boosters that promote coupling the energy train between subassemblies of the perforation tool assembly 200, for example between the perforation gun 202 and the spacer 280.

To reduce the speed of energy train propagation through the spacer 204 parallel to the axis of the spacer 204, $V_e$, the path of the detonation cord 282 within the spacer 280 is not straight. It is noted that the speed of the energy train propagation parallel to the axis of the spacer 204, $V_e$, is directed downwards along the perforation tool assembly 200, and hence a longer detonation cord 282 leads to a reduced speed of the energy train propagation through the spacer 204 parallel to the axis of the spacer 204, $V_e$. To increase its length, the detonation cord 282 may be zig-zagged, wound in a helical pattern, or otherwise assembled into the spacer 280. To increase its length, the detonation cord 282 may be installed within the spacer 280 with one or more loops.

Given the length of the detonation cord 282 and the length of the spacer 280, a delay introduced by the spacer 280 in the energy train can be determined. Different spacers 280 can be manufactured providing different amounts of delay. When designing the perforation tool assembly 200, designers may select from standard spacers 280 to provide the energy train delays desired to mitigate shock load in the perforation tool assembly 200. It is understood that this technique of increasing the length of the detonation cord 282 may also be applied to the design of the perforation gun 202. In some contexts, the extension of the length of the detonation cord 282 relative to a straight path through the spacer 204 may be referred to as a moderator. Additionally, in some contexts the increased length of the detonation cord 282 may be referred to as a delay element.

In an embodiment, the speed of energy train propagation through the spacer 280 may be reduced to achieve an overall reduction in speed of energy train propagation parallel to the axis of the perforation tool assembly 200, $V_e$, across the whole perforation tool assembly 200 by an amount in the range from 1% to 50% with reference to a spacer design having an energy train path that is straight. Alternatively, in an embodiment, the speed of energy train propagation through the spacer 280 may be reduced to achieve an overall reduction in speed of energy train propagation parallel to the axis of the perforation tool assembly 200, $V_e$, across the whole perforation tool assembly 200 by an amount in the range from 15% to 30% with reference to a spacer design having an energy train path that is straight.

Figure 6:
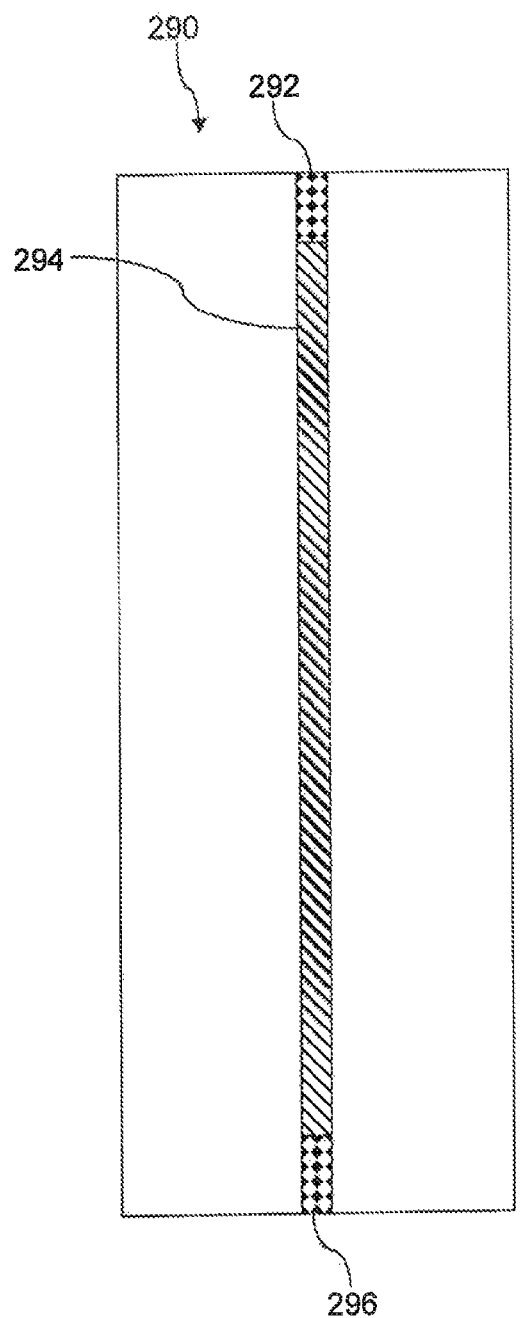
FIG. 6 is an illustration of another spacer according to an embodiment of the disclosure.

Turning now to FIG. 6, a spacer 290 is described. In an embodiment, the spacer 290 may be incorporated into the perforation tool assembly 200 between two perforation guns 202 and provides at least a portion of the energy train between the two perforation guns 202. The spacer 290 may further comprise coupling structures (not shown), e.g., threaded couplings, to connect to perforation guns 202, to other spacers 204, and/or to foot 206. The spacer 290 may comprise a modified detonation cord 294 coupled at an upper end to a first segment of standard detonation cord 292 and coupled at a lower end to a second segment of standard detonation cord 296. Alternatively, in an embodiment, the modified detonation cord 294 may couple to a first explosive booster at one end of the spacer 290 and may couple to a second explosive booster at the opposite end of the spacer 290, where the explosive boosters promote coupling the energy train between subassemblies of the perforation tool assembly 200, for example between the perforation gun 202 and the spacer 290. The modified detonation cord 294 may propagate detonation at a slower speed than standard detonation cord, thereby reducing the speed of the energy train propagation in the spacer 290 parallel to the axis of the spacer 290, $V_e$, thereby promoting mitigation of the shock load or the attenuation of shock load. The modified detonation cord 294 may be made by adding dilutants and/or by adding less energetic explosive materials to the explosive composition of standard detonation cord. Alternatively, the modified detonation cord 294 may simply be composed of a different explosive composition than standard detonation cord such that the modified detonation cord 294 detonates at a slower rate than standard detonation cord.

In an embodiment, the speed of energy train propagation through the spacer 290 may be reduced to achieve an overall reduction in speed of energy train propagation parallel to the axis of the perforation tool assembly 200, $V_e$, across the whole perforation tool assembly 200 by an amount in the range from 1% to 50% with reference to a spacer design using standard detonation cord. Alternatively, in an embodiment, the speed of energy train propagation through the spacer 290 may be reduced to achieve an overall reduction in speed of energy train propagation parallel to the axis of the perforation tool assembly 200, $V_e$, across the whole perforation tool assembly 200 by an amount in the range from 15% to 30% with reference to a spacer design using standard detonation cord.

In some contexts, the modified detonation cord 294 may be referred to as a moderator. Additionally, in some contexts the modified detonation cord 294 may be referred to as a delay element.

Figure 7:
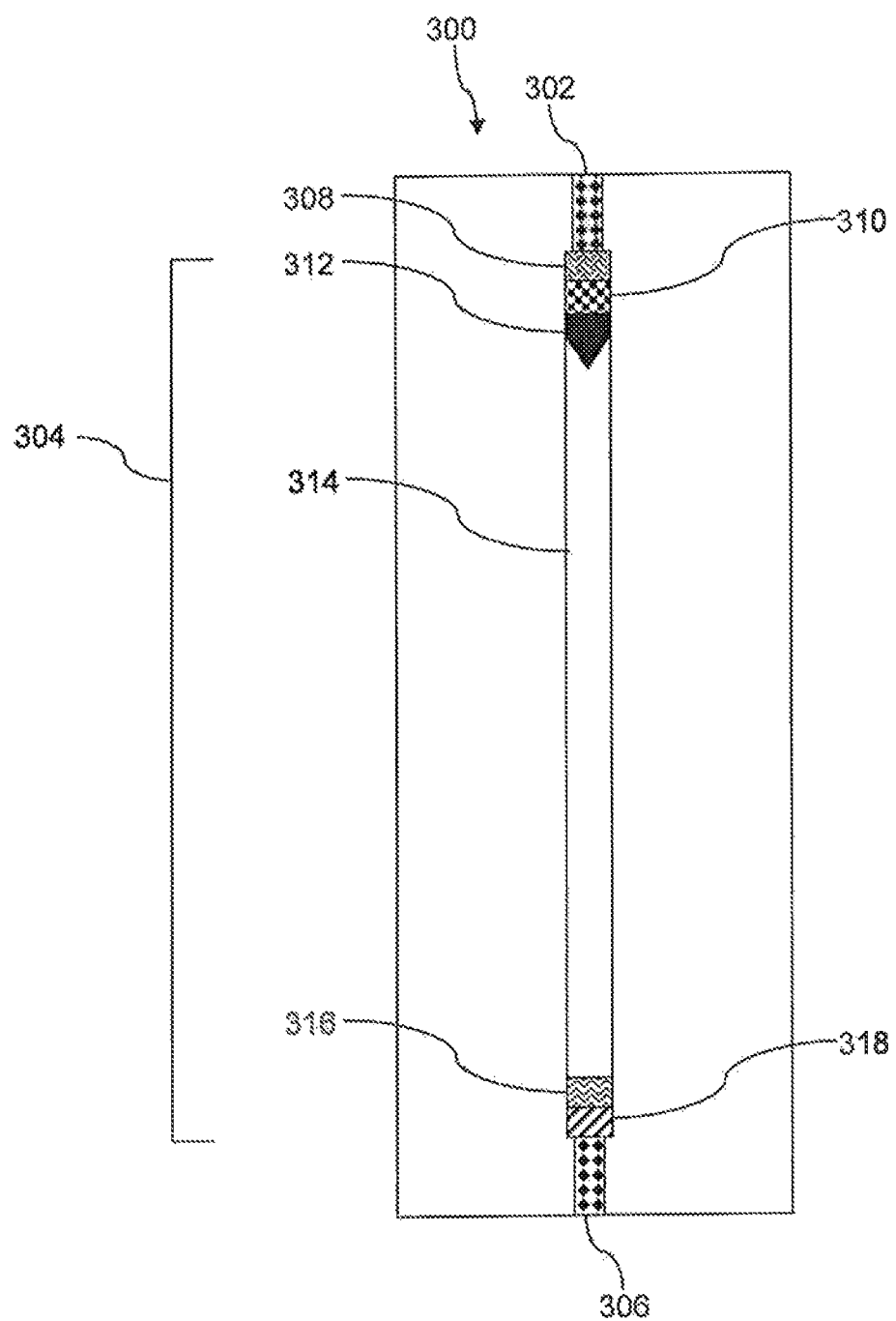
FIG. 7 is an illustration of yet another spacer according to an embodiment of the disclosure.

Turning now to FIG. 7, a spacer 300 is described. In an embodiment, the spacer 300 may be incorporated into the perforation tool assembly 200 between two perforation guns 202 and provides at least a portion of the energy train between the two perforation guns 202. The spacer 300 may further comprise coupling structures (not shown), e.g., threaded couplings, to connect to perforation guns 202, to other spacers 204, and/or to foot 206. The spacer 300 may comprise a gun assembly 304 that propagates the energy train at least in part based on kinetic energy imparted to a bullet 312. The gun assembly 304 is coupled at an upper end to a first segment of detonation cord 302 and coupled at a lower end to a second segment of detonation cord 306. Alternatively, in an embodiment, the gun assembly 304 may couple to a first explosive booster at one end of the spacer 300 and may couple to a second explosive booster at the opposite end of the spacer 300, where the explosive boosters promote coupling the energy train between subassemblies of the perforation tool assembly 200, for example between the perforation gun 202 and the spacer 300.

When the detonation propagates via the first segment of detonation cord 302 to the gun assembly 304, a first activator 308 is energized, and the first activator 308 ignites a propellant 310. As the propellant 310 combusts it produces rapidly expanding gas that propels the bullet 312 down a gun barrel 314 at a velocity that is substantially slower than the speed of detonation propagation in standard detonation cord. For example, the bullet 312 may travel through the gun barrel 314 at an average speed of about 1500 feet per second while the speed of detonation propagation in standard detonation cord may be about 22000 feet per second. The bullet 312 strikes a percussion cap 316, the percussion cap 316 fires and energizes a second activator 318, and the second activator 318 causes the second segment of detonation cord 306 to detonate, thereby propagating the energy train downwards. By incorporating the spacer 300 into the perforation tool assembly 200, the speed of the detonation energy $V_e$ can be reduced, promoting mitigation of the shock load. It is understood that in an embodiment, the first activator 308 and the propellant 310 may be integrated into a single component. Likewise, the percussion cap 316 and the second activator 318 may be integrated into a single component. In some contexts, the gun assembly 304 may be referred to as a moderator. Additionally, in some contexts the gun assembly 304 may be referred to as a delay element.

While the gun assembly 304 provides a specific embodiment, the present disclosure contemplates and is consistent with other embodiments of mechanically slowing the propagation of the energy train. For example, the explosive propagation of the energy train may be transferred to a mechanical, hydraulic, or pneumatic propagation through a segment of the energy train, for example across a spacer 204. It would be expected that this mechanical, hydraulic, or pneumatic energy would propagate at a slower speed than the explosive detonation of detonation cord. For example, a propellant may generate gas to pressurize a piston that shears pins to activate a percussion cap that then actuates an explosive booster that couples into the next segment of the energy train, for example a perforation gun coupled to the subject spacer or other subassembly. This may be conceptualized as approximating a pressure-actuated firing head.

It is understood that the several approaches for offsetting the speed of the propagation of the energy train parallel to the axis of the perforation tool assembly 200, $V_e$, from the speed of the shock wave $V_s$ described above may be combined in a variety of ways to achieve the overall purpose of reducing the shock amplification 240 and/or attenuating the shock load at one or more points in the perforation tool assembly 200. Notwithstanding, in some downhole environments there may be advantages to relying mainly on the spacers 204, 280, 290, and/or 300 to offset these speeds and to reduce the shock amplification 240. In some downhole environments the space between the perforation guns 202 may be relatively large to provide a desired alignment with different production zones 40. Under such circumstances, long spacers or a plurality of spacers coupled to each other may be incorporated into the perforation tool assembly 200. Because the spacers 204, 280, 290, 300 may be considered to provide a delay that is proportional to length, greater length corresponds to greater delay and hence greater offset between the speed of the propagation of the energy train parallel to the axis of the perforation tool assembly 200, $V_e$, from the speed of the shock wave $V_s$. This approach may allow for a rapid propagation in the energy train within the perforation guns 202, which reduces the chances of charge-to-charge interference, while still promoting the offsetting of the speed of the propagation of the energy train parallel to the axis of the perforation tool assembly 200, $V_e$, from the speed of the shock wave $V_s$, thus promoting reducing the shock amplification 240.

In an embodiment, the speed of the shock wave $V_s$ may be changed. For example, one or more spacers 204 may be composed of a material associated with a $V_s$ that is different from $V_e$. In an embodiment, the tool body of one or more spacers 204 may be composed of non-steel material such as a composite material.

In an embodiment, one or more of the spacers may provide an acoustic impedance mismatch, such that shock wave energy incident on the subject spacer is partly reflected at the interface with the spacer, thereby attenuating the shock wave energy that propagates through the spacer. A variety of methods of implementing this impedance mismatch are consistent with the present disclosure. For example, an impedance mismatch may be achieved by rapidly changing cross-section or density of the spacer relative to the remainder of the perforation tool assembly.

Figure 8:
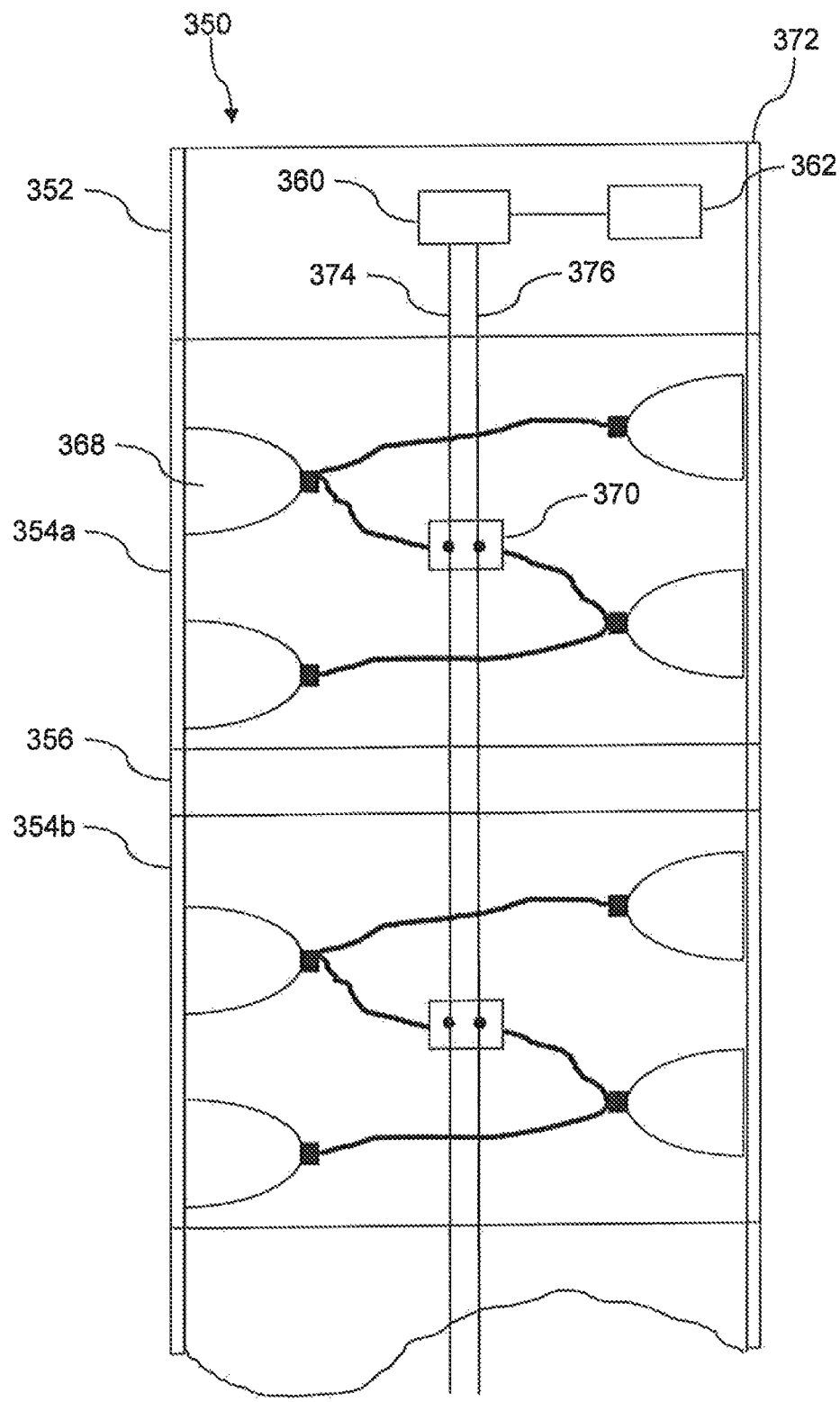
FIG. 8 is an illustration of another perforation tool assembly according to an embodiment of the disclosure.

Turning now to FIG. 8, a perforation tool assembly 350 is described. The perforation tool assembly 350 comprises a plurality of perforation guns 354, for example a first perforation gun 354a and a second perforation gun 354b. The perforation tool assembly 350 may comprise one or more spacers 356. The perforation tool assembly 350 comprises an activation subassembly 352 that comprises an electrical firing unit 360 and an electrical energy source 362, e.g., a battery. It is understood that in an embodiment the electrical energy source 362 may be integrated with the electrical firing unit 360. The electrical firing unit 360 transmits an electrical firing signal for example an electrical firing voltage on a first electrical conductor 374 and provides a ground voltage on a second electrical conductor 376. The electrical conductors 374, 376 extend downwards through perforation tool assembly 350 and couples to a detonation actuation unit 370 located in each perforation gun 354. In some contexts, the detonation actuation unit 370 may be referred to as an electrically actuated detonation initiator. When the detonation actuation unit 370 receives the electrical firing voltage, the detonation actuation unit 370 activates a detonation in detonation cord that fires explosive charges 368 carried by the perforation gun 354. In an embodiment, the ground conductor may be provided by a tool body 372 of the perforation tool assembly 350, a ground terminal of each of the electrical firing unit 360 and the detonation actuation unit 370 may be coupled to the tool body 372, and the second electrical conductor 376 may be omitted from the perforation tool assembly 350. Alternatively, the second electrical conductor 376 may provide a redundant or back-up firing path.

It is understood that any of a variety of electrical conductors 374, 376 may be employed in building the perforation tool assembly 350, for example electrical conductors 374, 376 may be employed that promote rapid propagation of the electrical firing voltage from the electrical firing unit 360 to each of the detonation actuation units 370. In an embodiment, twin-lead cable may be employed, for example a first wire or multistranded wire of the twin-lead cable may provide the first electrical conductor 374 and a second wire or multistranded wire of the twin-lead cable may provide the second electrical conductor 376. In an embodiment, coaxial cable may be employed, for example a core of the coaxial cable may provide the first electrical conductor 374 and a shield of the coaxial cable may provide the second electrical conductor 376. In an embodiment, the electrical conductors 374, 376 may be heavy gauge wires. In other embodiments, other kinds of electrical conductors 374, 376 may be employed.

The propagation of the electrical firing signal and/or electrical firing voltage from the electrical firing unit 360 may be considered to be an energy train just as the propagation of detonation down a detonation cord may be so considered. The electrical firing voltage propagates to the perforation guns 354 much faster than the shock wave propagates in the tool body 372, thereby reducing the shock load. In an embodiment, the electrical firing signal may be a predefined voltage level, current level, or sequence of values of either voltage or current levels. The detonation actuation units 370 may be selected and/or addressed by the electrical firing signals to fire separately. Alternatively, the detonation actuation units 370 may be configured with time delays such that once activated they wait their configured time delay and then actuate firing of the explosive charges 368. By configuring the time delays of the several detonation actuation units 370, a variety of sequences for firing the perforation guns 354 may be implemented. In an embodiment, the time delays may be configured to fire the perforation guns 354 substantially concurrently. In an embodiment, the detonation actuation units 370 are configured with timing to mitigate the shock load in the perforation tool assembly 350.

In an embodiment, the electrical firing unit 360 may communicate with the detonation actuation units 370 by a communication link other than the electrical conductors 374, 376, for example wirelessly via a wireless communication link. In an embodiment, the electrical firing unit 360 may be signaled from the surface to begin a firing sequence, for example by means of a pressure signal. The pressure signal may be a pressure that exceeds a threshold. Alternatively, the pressure signal may be a sequence of pressure values that match a distinctive pressure sequence configured into the electrical firing unit 360.

Figure 9:
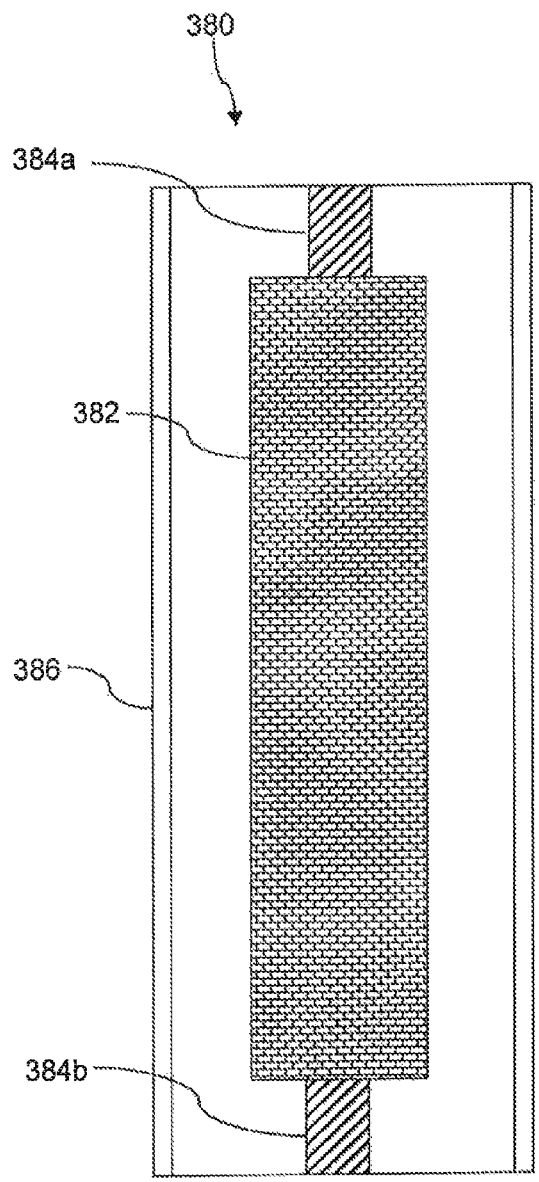
FIG. 9 is an illustration of mass energy absorber according to an embodiment of the disclosure.

Turning now to FIG. 9, a mass energy absorber 380 is described. The mass energy absorber 380 is suitable for incorporation into the perforation tool assembly 200 to alter the propagation of the shock wave through the perforation tool assembly 200. It is understood that a plurality of mass energy absorbers 380 may be placed at one or more positions within the perforation tool assembly 200. In an embodiment, the mass energy absorber 380 comprises a mass 382, a first absorber 384a, and a second absorber 384b. The absorbers 384 are coupled to and support the mass 382 within a tool body 386 during normal displacements of the mass energy absorber 380 and/or the perforation tool assembly 200. When a shock wave propagates to the mass energy absorber 380 via coupling of the tool body 386 to the perforation tool assembly 200, the inertia of the mass 382 resists displacement, the absorbers 384 deform, energy is removed from the shock wave, and the shock load that propagates on beyond the mass energy absorber 380 is attenuated. The absorbers 384 may comprise crushable structures such as a non-linear stiffness device that is designed to be relatively stiff until a critical load or stress level is reached, at which point the absorber loses its stiffness and absorbs energy. The mass 382 may be centralized within the tool body 386 by soft polymeric stand-off buttons or rings or other structures that exhibit low axial coupling between the mass 382 and the tool body 386. It is understood that the mass energy absorber 380 may be implemented in other configurations than those described with reference to FIG. 9.

Figure 10:
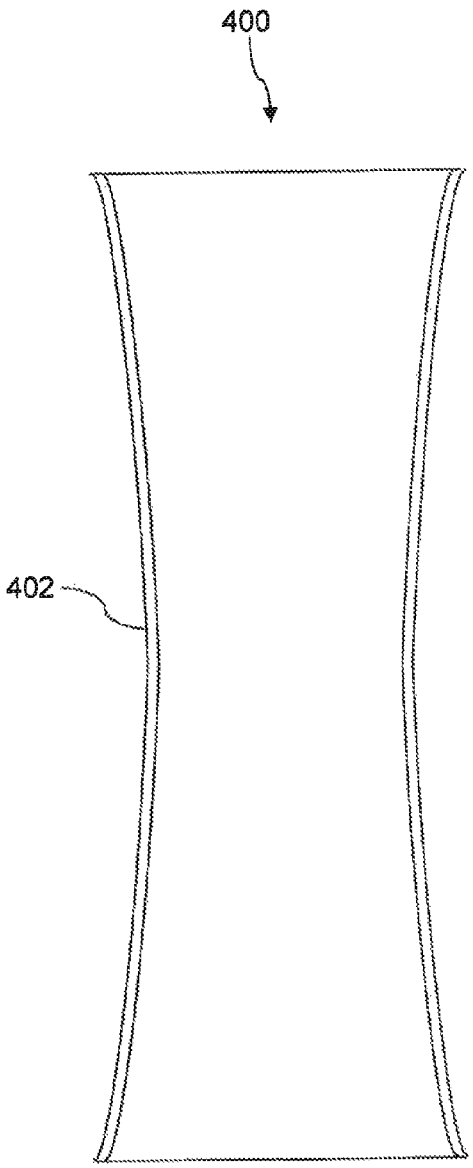
FIG. 10 is an illustration of a deformable energy absorber according to an embodiment of the disclosure.

Turning now to FIG. 10, a deformable energy absorber 400 is described. The deformable energy absorber 400 is suitable for incorporation into the perforation tool assembly 200 to alter the propagation of the shock wave through the perforation tool assembly 200. It is understood that a plurality of deformable energy absorbers 400 may be placed at one or more positions within the perforation tool assembly 200. In an embodiment, the deformable energy absorber 400 comprises a tool body 402 that exhibits non-linear elasticity. When axially directed forces below a threshold are applied to the deformable energy absorber 400, the tool body 402 maintains a relatively high effective stiffness. When axially directed forces above the threshold are applied to the deformable energy absorber 400, for example the forces in the shock load, the tool body 402 deforms or crushes readily and absorbs rather than transfers forces beyond the threshold. It is understood that the deformable energy absorber 400 may be implemented in a variety of configurations. For example, the deformable energy absorber 400 may comprise a honey comb of thin walls.

Turning now to FIG. 11, a hydraulic shock absorber 410 is described. The shock absorber 410 is suitable for incorporation into the perforation tool assembly 200 to alter the propagation of the shock wave through the perforation tool assembly 200. It is understood that a plurality of hydraulic shock absorbers 410 may be placed at one or more positions within the perforation tool assembly 200. In an embodiment, the hydraulic shock absorber 410 comprises a piston 412, a chamber 414, and a compressible fluid 416. When axially directed forces are applied to the hydraulic shock absorber 410, the piston 412 slides into the chamber 414 reducing the volume of the compressible fluid 416, thereby further compressing the fluid 416, performing work, and hence attenuating the shock load. It is understood that the hydraulic shock absorber 410 may take on a variety of configurations. In an embodiment, the hydraulic shock absorber 410 comprises two internal chambers separated by a ported bulkhead. Yet other configurations of the hydraulic shock absorber 410 are contemplated by the present disclosure.

Turning now to FIG. 12, a decoupler 420 is described. The decoupler 420 is suitable for incorporation into the perforation tool assembly 200 to alter the propagation of the shock wave through the perforation tool assembly 200. It is understood that a plurality of decouplers 420 may be placed at one or more positions within the perforation tool assembly 200. The decoupler 420 comprises a sleeve coupled to a tool body 424 by shear pins 426. When axial force beyond a threshold is applied to the decoupler 420, the shear pins 426 shear, the sleeve 422 and tool body 424 are free to stroke relative to each other within limits of displacement, and the shock wave incident on one end of the decoupler 420 is decoupled from the other end of the decoupler 420 and hence does not propagate beyond the decoupler 420. When the perforation tool assembly 200 and/or the work string 30 is removed from the wellbore 12, the sleeve 422 slides out of the tool body 424 until a split ring engaged by the sleeve 422 engages with and captures groove 430 in the tool body 424, thereby once again coupling the sleeve 422 and the tool body 424.

It is understood that any of the mass energy absorber 380, deformable energy absorber 390, hydraulic shock absorber 410, and/or decoupler 420 may comprise an energy train segment. Also, it is understood that the role of one or more of the spacers 204 may be provided by the mass energy absorber 380, deformable energy absorber 400, hydraulic shock absorber 410, and/or decoupler 420 Further, it is understood that the mass energy absorber 380, deformable energy absorber 400, hydraulic shock absorber 410, and/or decoupler 420 may be used in combination with each other and further in combination with the several approaches described above for altering the speed of propagation of the energy train parallel to the axis of the perforation tool assembly 200.

In an embodiment, the decoupler 420 may incorporate energy absorbing material or rubber pads that provide a low effective stiffness that allows relative motion, possibly over a limited range of motion, between perforation guns. In an embodiment, the decoupler 420 may be used without shear pins to provide a low initial stiffness. The decoupler 420 may connect to the energy train by using explosive boosters in the energy train, for example a booster charge in the perforation gun 202, to shoot across space gaps resulting from the relative motion.

Figure 13:
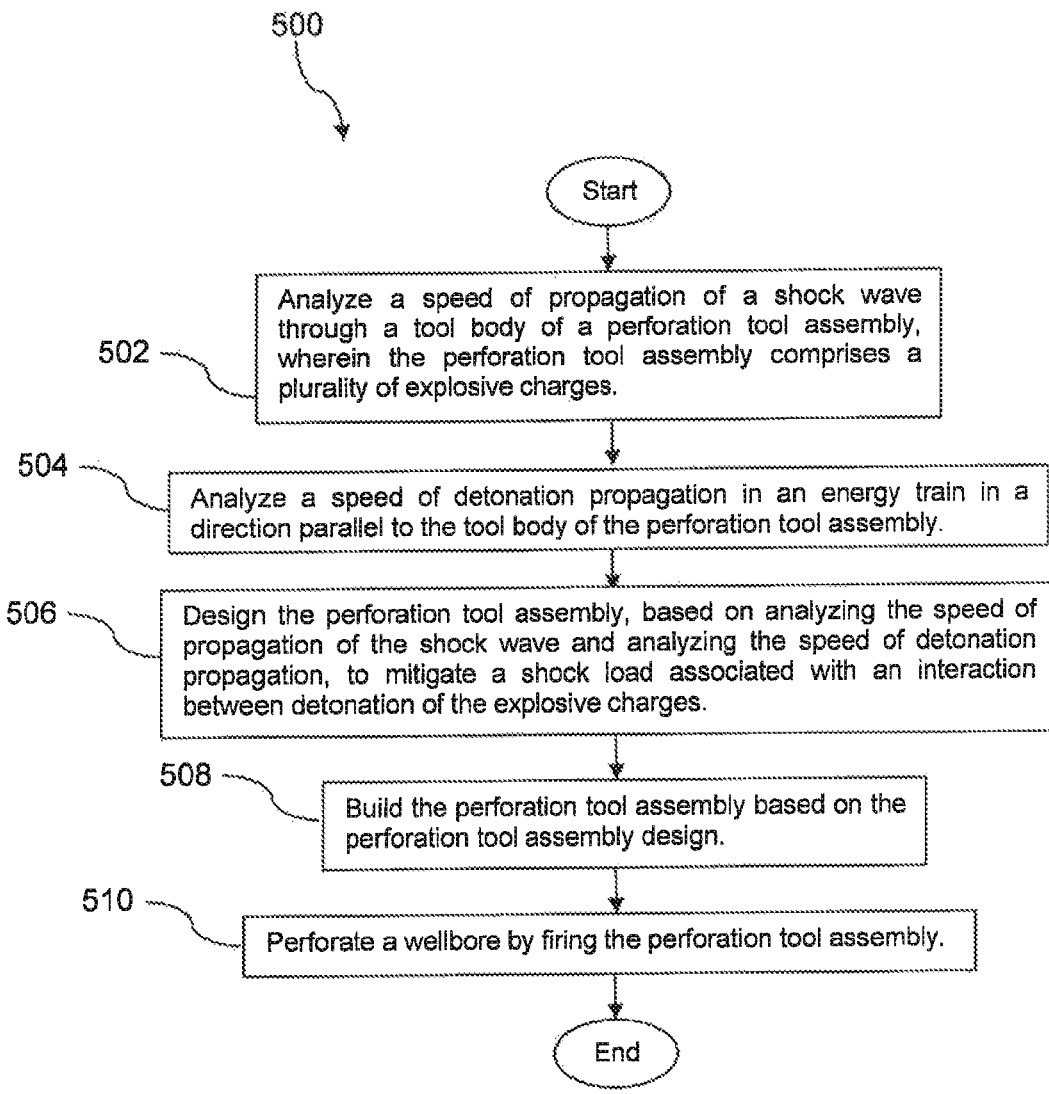
FIG. 13 is a flow chart according to an embodiment of the disclosure.

Turning now to FIG. 13, a method 500 is described. At block 502, a speed of shock wave propagation through a tool body of a perforation tool assembly is analyzed, wherein the perforation tool assembly comprises a plurality of explosive charges. For example, the speed of a longitudinal wave propagating in the tool body of the perforation tool assembly 200 and parallel to the axis of the perforation tool assembly 200 is analyzed based on assumptions such as the material composition of the tool body, the downhole conditions projected to prevail in the wellbore 12 when the perforation tool assembly 200 is fired, and other parameters. The analysis of block 502 may take into account the presence of mass energy absorbers 380, deformable energy absorbers 400, hydraulic shock absorbers 410, and/or decouplers 420 incorporated in the perforation tool assembly 200. The analysis may be performed at least in part using a modeling application that executes on a computer system, for example a SHOCKPRO modeling application available from Halliburton. For more information about shock modeling see International application PCT/US2010/061104 entitled "Modeling Shock Produced by Well Perforating" filed Dec. 17, 2010, which is hereby incorporated by reference for all purposes in its entirety. At block 504, a speed of detonation propagation in an energy train in a direction parallel to the axis of the perforation tool assembly 200 is analyzed. The analysis may be performed at least in part using a modeling application that executes on a computer system. The analysis is based on the composition and/or construction of the energy train.

At block 506, based on analyzing the speed of the propagation of the shock wave and analyzing the speed of detonation propagation, the perforation tool assembly is designed to mitigate a shock load associated with an interaction between detonations of the explosive charges. In an embodiment, the perforation tool assembly is designed to offset the speed of shock wave propagation in the tool body of the perforation gun assembly from the speed of detonation propagation in the direction parallel to the axis of the tool body of the perforation tool assembly by at least 5%. In other words, the design of the perforation tool assembly is changed to result in $V_e/V_s$ greater than or equal to 1.05 or $V_e/V_s$ less than or equal to 0.95. In another embodiment, the perforation tool assembly is designed to offset the speed of shock wave propagation in the tool body of the perforation gun assembly from the speed of detonation propagation in the direction parallel to the axis of the tool body of the perforation tool assembly by at least 15%. In another embodiment, the perforation tool assembly is designed to offset the speed of shock wave propagation in the tool body of the perforation gun assembly from the speed of detonation propagation in the direction parallel to the axis of the tool body of the perforation tool assembly by at least 30%.

The design may be changed in any of a variety of manners to offset the speeds, including incorporating structures and/or subassemblies into the perforation tool assembly 200 that alter the speed of detonation propagation in the energy train in the direction parallel to the axis of the tool body of the perforation tool assembly 200. For example, structures described more fully above with reference to FIG. 4, FIG. 5, FIG. 6, FIG. 7, and FIG. 8 may be incorporated into the perforation tool assembly 200. These structures may comprise one or more of a spacer incorporating an indirect path into an energy train segment of the spacer, a spacer incorporating a reduced speed detonation cord into an energy train segment of the spacer, a spacer incorporating a bullet firing gun as a portion of an energy train segment of the spacer, and a perforation gun incorporating a reduced speed detonation cord into an energy train segment of the perforation gun. Additionally, in an embodiment, the composition of the tool body of the perforation tool assembly may be changed to alter the speed of propagation of the shock wave propagation in the perforation tool assembly 200. One or more of the structures may delay propagation of the energy train in the direction parallel to the axis of the perforation tool assembly 200.

Additionally, in an embodiment, structures may be incorporated into the perforation tool assembly 200 to alter the dynamics of the perforation tool assembly 200 and to alter the propagation of the shock wave in the perforation tool assembly 200. For example, one or more of the mass energy absorber 380, the deformable energy absorber 400, the hydraulic shock absorber 410, a spacer providing an acoustic impedance mismatch, or the decoupler 420 may be incorporated into the perforation tool assembly 200. Additionally, the properties of these structures may be altered to desirably alter the propagation of the shock wave in the perforation tool assembly 200. The steps 502, 504, 506 may be iteratively performed to converge on a design that achieves one or more design criterion. In an embodiment, the steps 502, 504, 506 may be performed across a plurality of different perforation jobs. For example, sensors that capture measurements of shock loads in the subject perforation tool assemblies may be incorporated into the perforation tool assembly 200, the data captured during the course of a perforation job may be retrieved from these sensors after the perforation job is completed, and the data may be used to adapt or tune the analyzing performed in blocks 502, 504 and/or the designing performed in block 506. At least some of the processing of blocks 502, 504, and/or 506 may be performed by an application executing on a computer system.

At block 508, a perforation tool assembly is built based on the changed perforation tool assembly design. At block 510, a wellbore is perforated by firing the perforation tool assembly.

Figure 14:
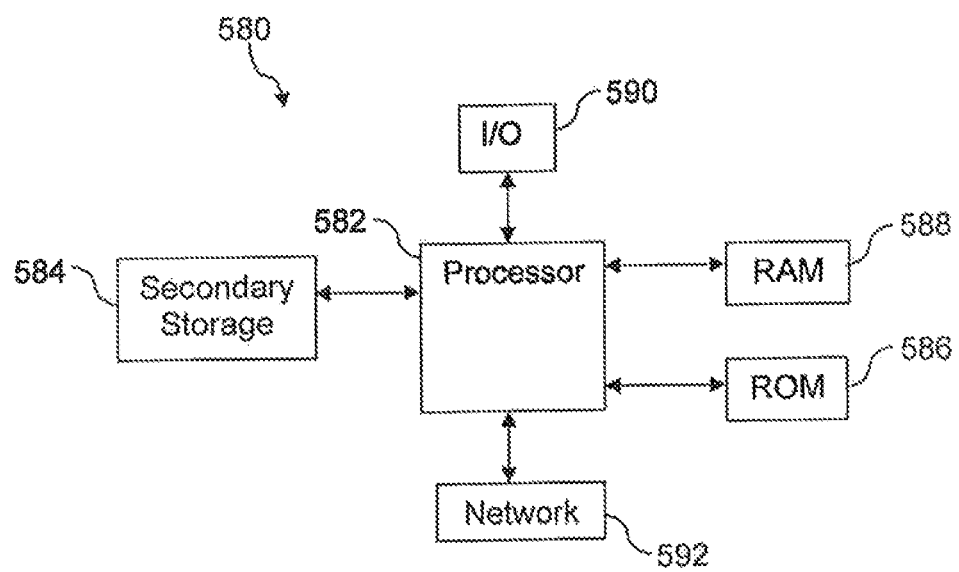
FIG. 14 is an illustration of a computer according to an embodiment of the disclosure.

FIG. 14 illustrates a computer system 580 suitable for implementing one or more embodiments disclosed herein. For example, the analysis performed in bocks 502 and 504 of method 500 described above with reference to FIG. 13 may be promoted by executing a modeling application on the computer system 580. Further, the designing performed in block 206 may be performed at least in part using a design application executing on the computer system 580. The computer system 580 includes a processor 582 (which may be referred to as a central processor unit or CPU) that is in communication with memory devices including secondary storage 584, read only memory (ROM) 586, random access memory (RAM) 588, input/output (I/O) devices 590, and network connectivity devices 592. The processor 582 may be implemented as one or more CPU chips.

It is understood that by programming and/or loading executable instructions onto the computer system 580, at least one of the CPU 582, the RAM 588, and the ROM 586 are changed, transforming the computer system 580 in part into a particular machine or apparatus having the novel functionality taught by the present disclosure. It is fundamental to the electrical engineering and software engineering arts that functionality that can be implemented by loading executable software into a computer can be converted to a hardware implementation by well known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage 584 is typically comprised of one or more disk drives or tape drives and is used for non-volatile storage of data and as an over-flow data storage device if RAM 588 is not large enough to hold all working data. Secondary storage 584 may be used to store programs which are loaded into RAM 588 when such programs are selected for execution. The ROM 586 is used to store instructions and perhaps data which are read during program execution. ROM 586 is a non-volatile memory device which typically has a small memory capacity relative to the larger memory capacity of secondary storage 584. The RAM 588 is used to store volatile data and perhaps to store instructions. Access to both ROM 586 and RAM 588 is typically faster than to secondary storage 584. The secondary storage 584, the RAM 588, and/or the ROM 586 may be referred to in some contexts as computer readable storage media and/or non-transitory computer readable media.

I/O devices 590 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 592 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or other air interface protocol radio transceiver cards, and other well-known network devices. These network connectivity devices 592 may enable the processor 582 to communicate with the Internet or one or more intranets. With such a network connection, it is contemplated that the processor 582 might receive information from the network, or might output information to the network in the course of performing the above-described method steps. Such information, which is often represented as a sequence of instructions to be executed using processor 582, may be received from and outputted to the network, for example, in the form of a computer data signal embodied in a carrier wave.

Such information, which may include data or instructions to be executed using processor 582 for example, may be received from and outputted to the network, for example, in the form of a computer data baseband signal or signal embodied in a carrier wave. The baseband signal or signal embodied in the carrier wave generated by the network connectivity devices 592 may propagate in or on the surface of electrical conductors, in coaxial cables, in waveguides, in an optical conduit, for example an optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, may be generated according to several methods well known to one skilled in the art. The baseband signal and/or signal embedded in the carrier wave may be referred to in some contexts as a transitory signal.

The processor 582 executes instructions, codes, computer programs, scripts which it accesses from hard disk, floppy disk, optical disk (these various disk based systems may all be considered secondary storage 584), ROM 586, RAM 588, or the network connectivity devices 592. While only one processor 582 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 584, for example, hard drives, floppy disks, optical disks, and/or other device, the ROM 586, and/or the RAM 588 may be referred to in some contexts as non-transitory instructions and/or non-transitory information.

In an embodiment, the computer system 580 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 580 to provide the functionality of a number of servers that is not directly bound to the number of computers in the computer system 580. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

In an embodiment, some or all of the functionality disclosed above may be provided as a computer program product. The computer program product may comprise one or more computer readable storage medium having computer usable program code embodied therein to implement the functionality disclosed above. The computer program product may comprise data structures, executable instructions, and other computer usable program code. The computer program product may be embodied in removable computer storage media and/or non-removable computer storage media. The removable computer readable storage medium may comprise, without limitation, a paper tape, a magnetic tape, magnetic disk, an optical disk, a solid state memory chip, for example analog magnetic tape, compact disk read only memory (CD-ROM) disks, floppy disks, jump drives, digital cards, multimedia cards, and others. The computer program product may be suitable for loading, by the computer system 580, at least portions of the contents of the computer program product to the secondary storage 584, to the ROM 586, to the RAM 588, and/or to other non-volatile memory and volatile memory of the computer system 580. The processor 582 may process the executable instructions and/or data structures in part by directly accessing the computer program product, for example by reading from a CD-ROM disk inserted into a disk drive peripheral of the computer system 580. Alternatively, the processor 582 may process the executable instructions and/or data structures by remotely accessing the computer program product, for example by downloading the executable instructions and/or data structures from a remote server through the network connectivity devices 592. The computer program product may comprise instructions that promote the loading and/or copying of data, data structures, files, and/or executable instructions to the secondary storage 584, to the ROM 586, to the RAM 588, and/or to other non-volatile memory and volatile memory of the computer system 580.

In some contexts, a baseband signal and/or a signal embodied in a carrier wave may be referred to as a transitory signal. In some contexts, the secondary storage 584, the ROM 586, and the RAM 588 may be referred to as a non-transitory computer readable medium or a computer readable storage media. A dynamic RAM embodiment of the RAM 588, likewise, may be referred to as a non-transitory computer readable medium in that while the dynamic RAM receives electrical power and is operated in accordance with its design, for example during a period of time during which the computer 580 is turned on and operational, the dynamic RAM stores information that is written to it. Similarly, the processor 582 may comprise an internal RAM, an internal ROM, a cache memory, and/or other internal non-transitory storage blocks, sections, or components that may be referred to in some contexts as non-transitory computer readable media or computer readable storage media.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A downhole perforation tool assembly, comprising:
a first perforation gun comprising a first plurality of explosive charges and a first electrically actuated detonation initiator, wherein the first electrically actuated detonation initiator is coupled to at least one of the first plurality of explosive charges;
a second perforation gun, mechanically coupled to the first perforation gun, comprising a second plurality of explosive charges, a delay element, and a second electrically actuated detonation initiator, wherein the second electrically actuated detonation initiator is coupled to at least one of the second plurality of explosive charges; and
one or more electrical conductors coupled to the first and second electrically actuated detonation initiators and an electrical firing unit;
wherein both the first and second electrically actuated detonation initiators are configured to actuate in response to simultaneously receiving a single electrical signal conveyed by the one or more electrical conductors to detonate the first plurality of explosive charges and the second plurality of explosive charges respectively, wherein the delay element is configured to delay the detonation of the second plurality of explosive charges for a time delay after the detonation of the first plurality of explosive charges in response to receiving the single electrical signal, and wherein the timing of the actuating of the first and the second electrically actuated detonation initiators is controlled to mitigate a shock load in the perforation tool assembly associated with an interaction between the detonations of the first and second plurality of explosives, wherein the first and second electrically actuated detonation initiators are configured to actuate in response to the same single electrical signal conveyed by the one or more electrical conductors to detonate the first plurality of explosive charges and the second plurality of explosive charges.

2. The perforation tool assembly of claim 1, wherein the delay element is configured to implement the time delay between receiving the electrical signal from the electrical conductor and initiating detonation of the second plurality of explosive charges.

3. The perforation tool assembly of claim 1, further comprising a spacer located between the first perforation gun and the second perforation gun, wherein the one or more electrical conductors passes through an interior of the spacer.

4. The perforation tool assembly of claim 3, wherein the spacer has a tool body composed of a non-steel material.

5. The perforation tool assembly of claim 3, wherein the spacer has a tool body composed of a composite material.

6. The perforation tool assembly of claim 3, wherein the spacer is configured to provide an acoustic impedance mismatch.

7. The perforation tool assembly of claim 1, further comprising a third perforation gun comprising a third plurality of explosive charges and a third electrically actuated detonation initiator, wherein the third electrically actuated detonation initiator is coupled to at least one of the third plurality of explosive charges, wherein the one or more electrical conductors is coupled to the third electrically actuated detonation initiator, and wherein the third electrically actuated detonation initiator is configured to actuate in response to the same single electrical signal conveyed by the electrical conductor.

8. The perforation tool assembly of claim 1, wherein the downhole perforation tool assembly further comprises at least one structure that alters the propagation of the shock wave through the tool body of the perforation tool assembly.

9. The perforation tool assembly of claim 8, wherein the at least one structure that alters the propagation of the shock wave is selected from the group consisting of: a mass energy absorber, a deformable energy absorber, a hydraulic shock absorber, and a decoupler.

10. The perforation tool assembly of claim 1, wherein the downhole perforation tool assembly further comprises a plurality of structures that alters the propagation of the shock wave through the tool body of the perforation tool assembly.

11. A downhole perforation tool assembly, comprising:
a plurality of perforation guns, wherein each perforation gun of the plurality of perforation guns comprises a plurality of explosive charges;
a plurality of electrically actuated detonation initiators associated with each corresponding perforation gun of the plurality of perforation guns, wherein each electrically actuated detonation initiator in each of the plurality of perforation guns is coupled to at least one of the corresponding plurality of explosive charges;
an electrical conductor coupled to the each of the plurality of electrically actuated detonation initiators and an electrical firing unit; and
a delay element operably associated with at least one of the plurality of perforation guns,
wherein a plurality of electrically actuated detonation initiators are configured to actuate in response to receiving a single electrical signal conveyed by the electrical conductor to detonate each plurality of explosive charges, wherein the at least one of the plurality of perforation guns operably associated with the delay element is configured to detonated after a time delay from at least one other perforation gun of the plurality of perforation guns not comprising the delay element in response to receiving the single electrical signal, wherein the plurality of electrically actuated detonation initiators are configured to actuate in response to the same single electrical signal conveyed by the electrical conductor to detonate each plurality of explosive charges.

12. The assembly of claim 11, wherein at least two of the plurality of electrically actuated detonation initiators are configured to detonate substantially concurrently.

13. The assembly of claim 11, wherein the electrical signal comprises a voltage level, and wherein the plurality of electrically actuated detonation initiators are configured to actuate in response to the voltage level of the electrical signal exceeding a threshold.

14. The assembly of claim 11, wherein the electrical signal comprises a current level, and wherein the plurality of electrically actuated detonation initiators are configured to actuate in response to the current level of the electrical signal exceeding a threshold.

15. The assembly of claim 11, wherein the electrical signal comprises a voltage level and a current level, and wherein the plurality of electrically actuated detonation initiators are configured to actuate in response to a sequence of values of at least one of the voltage level or the current level of the electrical signal.

16. The assembly of claim 11, wherein the downhole perforation tool assembly further comprises at least one structure that alters the propagation of the shock wave through a body of the plurality of perforation guns.

17. The assembly of claim 16, wherein the at least one structure that alters the propagation of the shock wave is selected from the group consisting of: a mass energy absorber, a deformable energy absorber, a hydraulic shock absorber, and a decoupler.

18. The assembly of claim 11, further comprising a spacer located between at least two of the plurality of perforation guns, wherein the electrical conductor passes through an interior of the spacer.

19. The assembly of claim 18, wherein the spacer has a tool body composed of a non-steel material.

20. The assembly of claim 18, wherein the spacer is configured to provide an acoustic impedance mismatch.

\* \* \* \* \*